(12) United States Patent
Li et al.

(10) Patent No.: US 12,279,430 B2
(45) Date of Patent: Apr. 15, 2025

(54) CONFIGURABLE CAPACITORS WITH 3D NON-VOLATILE ARRAY

(71) Applicant: Western Digital Technologies, Inc., San Jose, CA (US)

(72) Inventors: Liang Li, Shanghai (CN); Xuan Tian, Shanghai (CN); Zhen Qin, Shanghai (CN); Yanli Zhang, San Jose, CA (US); Yan Li, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 302 days.

(21) Appl. No.: 17/954,757

(22) Filed: Sep. 28, 2022

(65) Prior Publication Data

US 2024/0114685 A1  Apr. 4, 2024

(51) Int. Cl.

| | |
|---|---|
| *H10B 43/27* | (2023.01) |
| *G11C 5/10* | (2006.01) |
| *G11C 11/24* | (2006.01) |
| *G11C 16/04* | (2006.01) |
| *G11C 16/30* | (2006.01) |
| *H10B 43/10* | (2023.01) |
| *H10B 43/40* | (2023.01) |
| *H10B 41/27* | (2023.01) |

(52) U.S. Cl.
CPC .............. *H10B 43/27* (2023.02); *G11C 5/10* (2013.01); *G11C 11/24* (2013.01); *G11C 16/0483* (2013.01); *G11C 16/30* (2013.01); *H10B 43/40* (2023.02); *G11C 2213/75* (2013.01); *H10B 43/10* (2023.02)

(58) Field of Classification Search
CPC ........ H10B 43/27; H10B 43/40; H10B 43/10; H10B 41/27; G11C 5/10; G11C 11/24; G11C 16/0483; G11C 16/30; G11C 2213/75
See application file for complete search history.

(56) References Cited

U.S. PATENT DOCUMENTS

| | | | |
|---|---|---|---|
| 6,515,903 B1 * | 2/2003 | Le ........................... | G11C 16/30 327/536 |
| 8,643,142 B2 | 2/2014 | Higashitani et al. | |
| 8,951,859 B2 | 2/2015 | Higashitani et al. | |
| 2022/0149063 A1 * | 5/2022 | Oh ........................ | G11C 11/5621 |
| 2022/0359543 A1 * | 11/2022 | Lee ....................... | H10D 64/033 |

* cited by examiner

*Primary Examiner* — Alexander Sofocleous
*Assistant Examiner* — James S Wells
(74) *Attorney, Agent, or Firm* — Pearl Cohen Zedek Latzer Baratz, LLP

(57) ABSTRACT

A stack of alternating layers of dielectric and conductive materials are formed on a substrate. A first portion of the stack of alternating layers forms a plurality of blocks of NAND memory. A second portion of the stack of alternating layers forms a configurable capacitor structure. The configurable capacitor structure is configurable to form one or more capacitors of configurable capacitance.

10 Claims, 22 Drawing Sheets

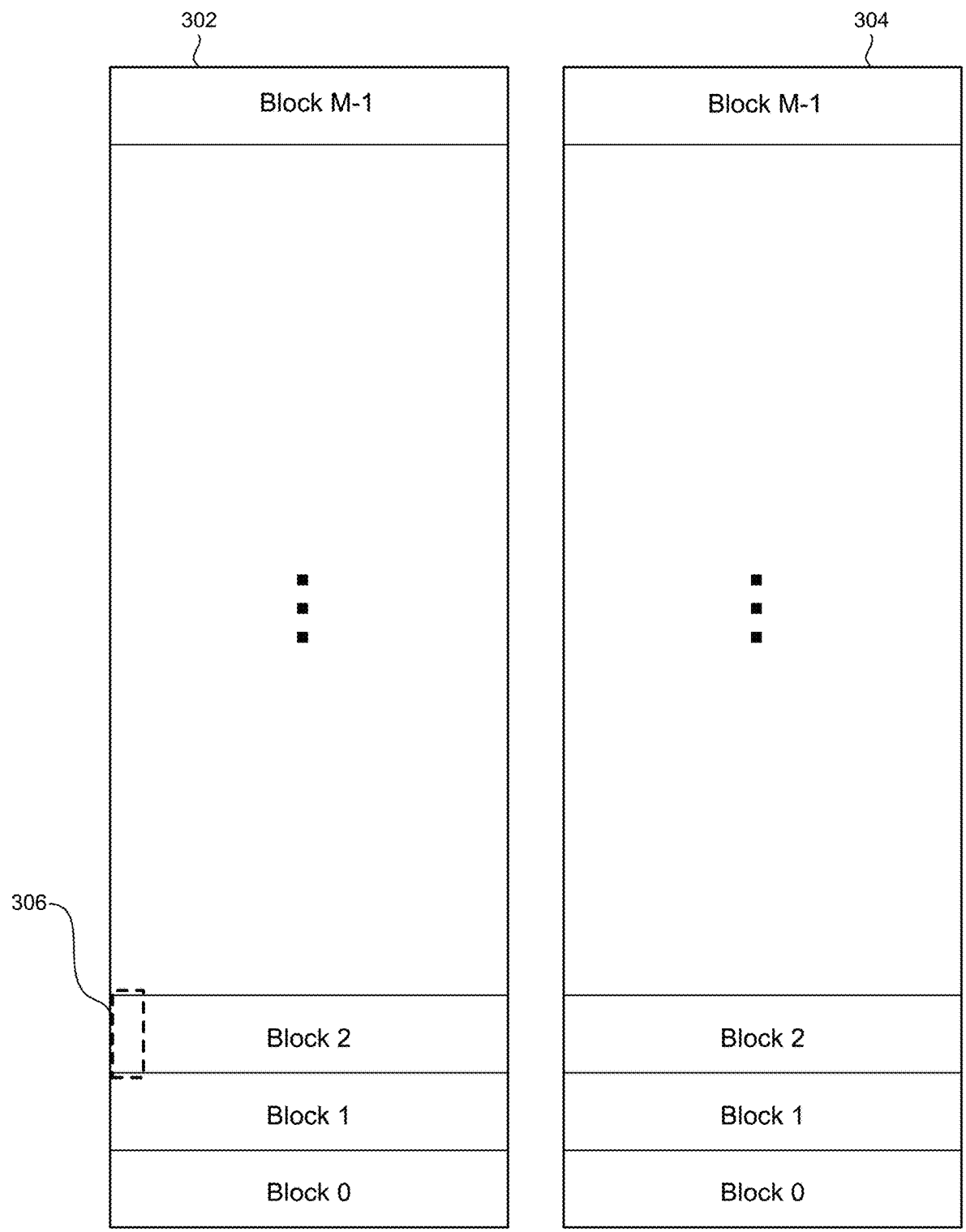

CONFIGURABLE CAPACITORS WITH 3D NON-VOLATILE ARRAY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIG. 4A is a block diagram of a memory structure having two planes.

DETAILED DESCRIPTION

Techniques are provided for using a stack of alternating layers of dielectric and conductive materials that is used to form a memory structure to also form one or more capacitors that are configurable to have a target capacitance. A first portion of such a stack may form a plurality of blocks of NAND memory while a second portion may form a configurable capacitor structure. The configurable capacitor structure may be configurable to form one or more capacitors, which may have configurable capacitance. A control circuit may be connected to the configurable capacitor structure to configure it to provide a capacitor having a target capacitance or multiple capacitors having multiple target capacitances. For example, a configurable capacitor structure may include multiple capacitive units and a control structure may connect a selected subset of capacitive units to form a capacitor having a target capacitance. Such configurable capacitors may enable a charge pump to be configured to output a range of different output voltages. A configurable capacitor structure may provide a large number of capacitive units according to the number of alternating layers, which may be more space efficient than forming such capacitors individually (e.g., in a peripheral area of a die). A configurable capacitor structure may provide redundant capacitors to allow for failure of one or more capacitors (e.g., when a capacitor fails, some or all capacitive units of the capacitor may be replaced by redundant unit(s)). Aspects of the present technology may provide technical solutions to the technical problems of efficient layout of components, including capacitors, in integrated circuits and device failure caused by failure of individual capacitors.

Figure 1:
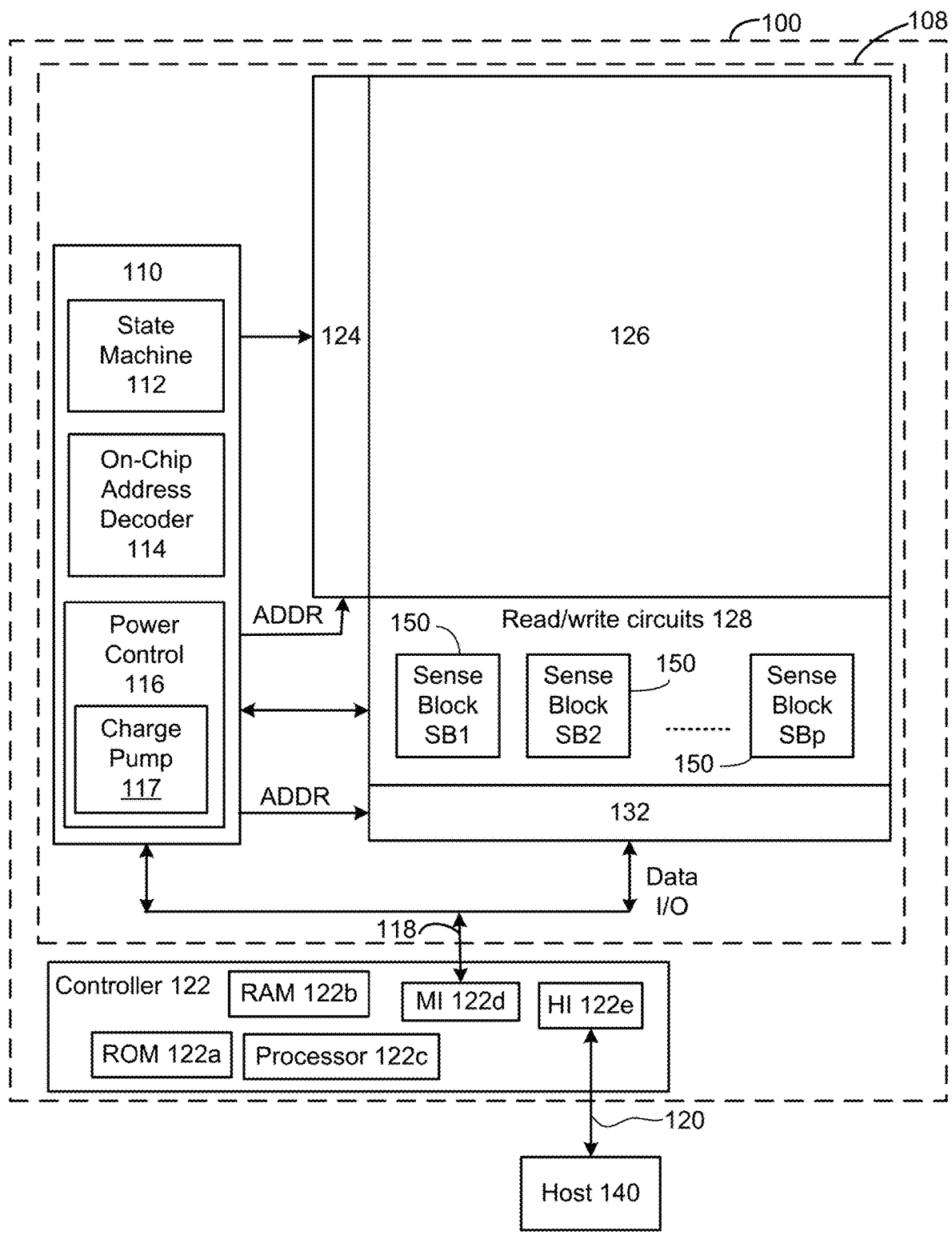
FIG. 1 is a functional block diagram of a memory device.

FIG. 1-FIG. 4D describe examples of memory systems that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 includes charge pumps 117 for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuit 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used. The exact type of memory array architecture or memory cell included in memory structure 126 is not limited to the examples above.

Figure 2A:
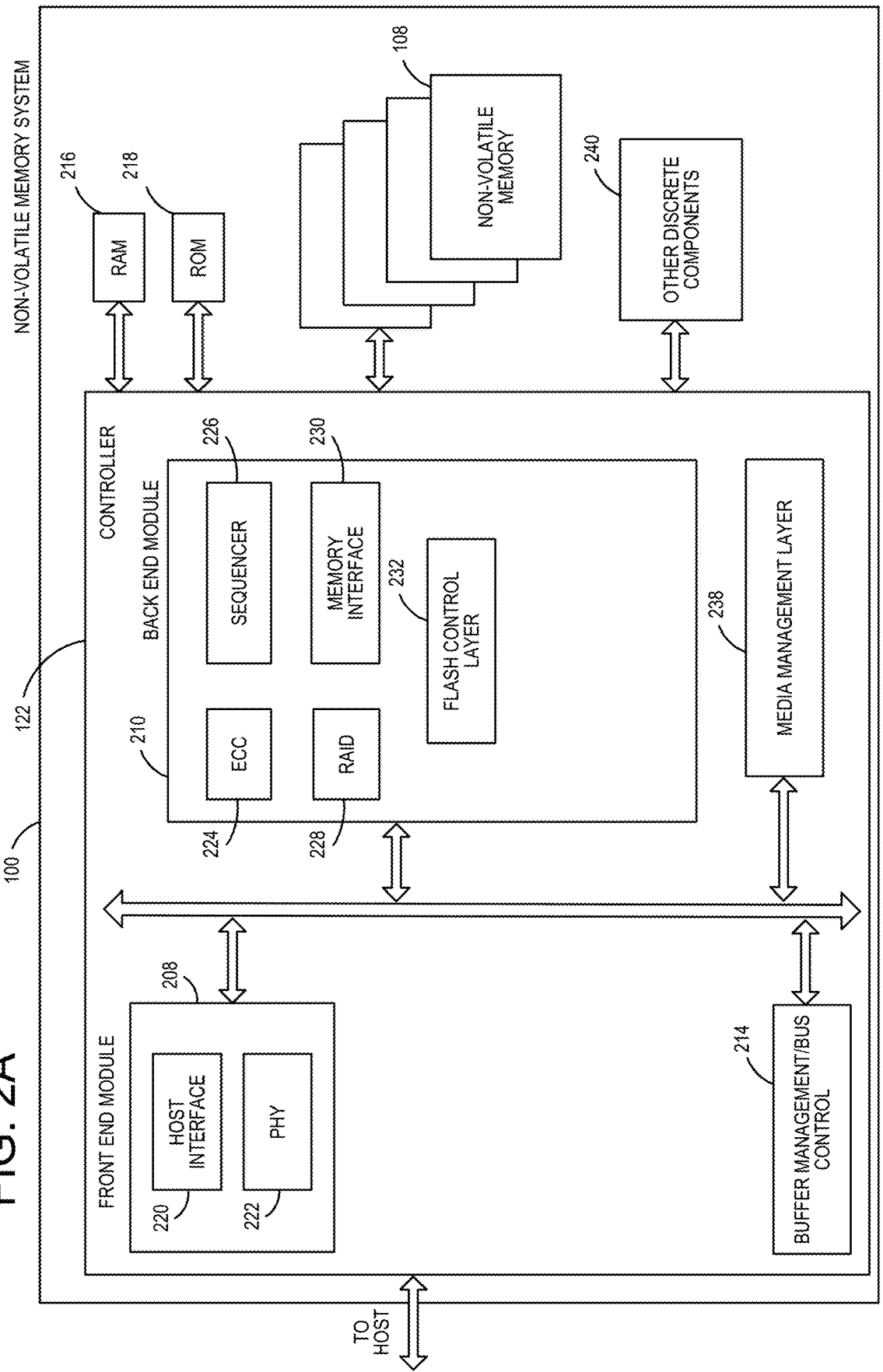
FIGS. 2A-B are block diagrams depicting embodiments of a memory system.

FIG. 2A is a block diagram of example memory system 100, depicting more details of one embodiment of controller 122. The controller in FIG. 2A is a flash memory controller but note that the non-volatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 2A include media management layer 238, which performs wear leveling of memory cells of non-volatile memory die 108. Memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of memory die 108. The MML 238 may be needed because: 1) the memory may have limited endurance; 2) the memory structure 126 may only be written in multiples of pages; and/or 3) the memory structure 126 may not be written unless it is erased as a block (or a tier within a block in some embodiments). The MML 238 understands these potential limitations of the memory structure 126 which may not be visible to the host. Accordingly, the MML 238 attempts to translate the writes from host into writes into the memory structure 126.

Controller 122 may interface with one or more memory dies 108. In one embodiment, controller 122 and multiple memory dies (together comprising non-volatile memory system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
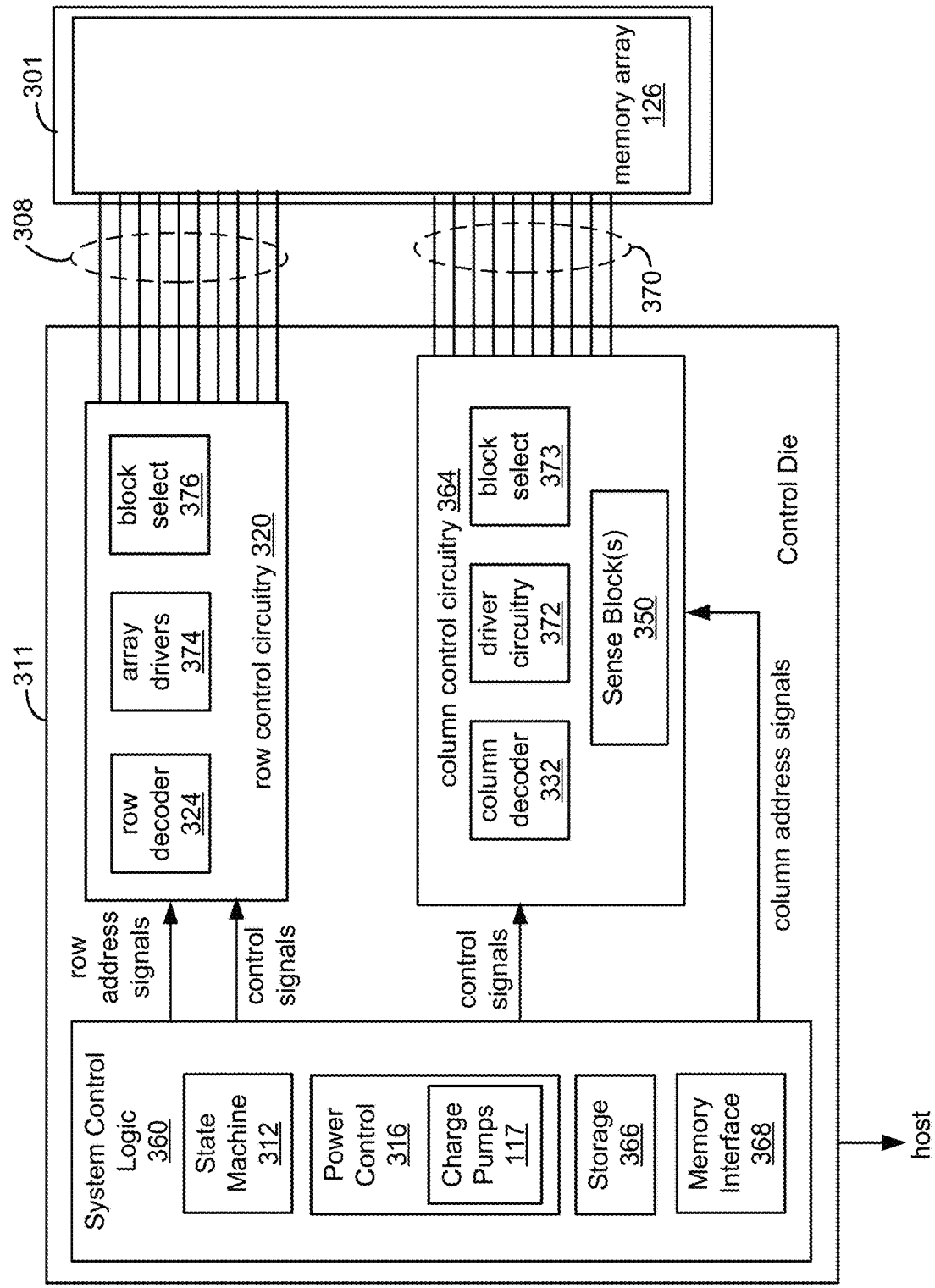

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in memory system 100. The integrated memory assembly 307 includes two types of semiconductor die (or more succinctly, "die"). Memory die 301 includes memory structure 126

Control die 311 includes column control circuitry 364, row control circuitry 320 and system control logic 360 (including state machine 312, power control module 316 (including charge pumps 117), storage 366, and memory interface 368). In some embodiments, control die 311 is configured to connect to the memory array 126 in the memory die 301. FIG. 2B shows an example of the peripheral circuitry, including control circuits, formed in a peripheral circuit or control die 311 coupled to memory array 126 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate memory controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 126 on the memory die 301 through electrical paths 370. For example, electrical paths 370 may provide electrical connection between column decoder 332, driver circuitry 372, and block select 373 and bit lines of memory array (or memory structure) 126. Electrical paths may extend from column control circuitry 364 in control die 311 through pads on control die 311 that are bonded to corresponding pads of the memory die 301, which are connected to bit lines of memory structure 126. Each bit line of memory structure 126 may have a corresponding electrical path in electrical paths 370, including a pair of bond pads, which connects to column control circuitry 364. Similarly, row control circuitry 320, including row decoder 324, array drivers 374, and block select 376 are coupled to memory array 126 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 126 is not limited to the examples above. Many different types of memory array architectures or memory cell technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—

Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
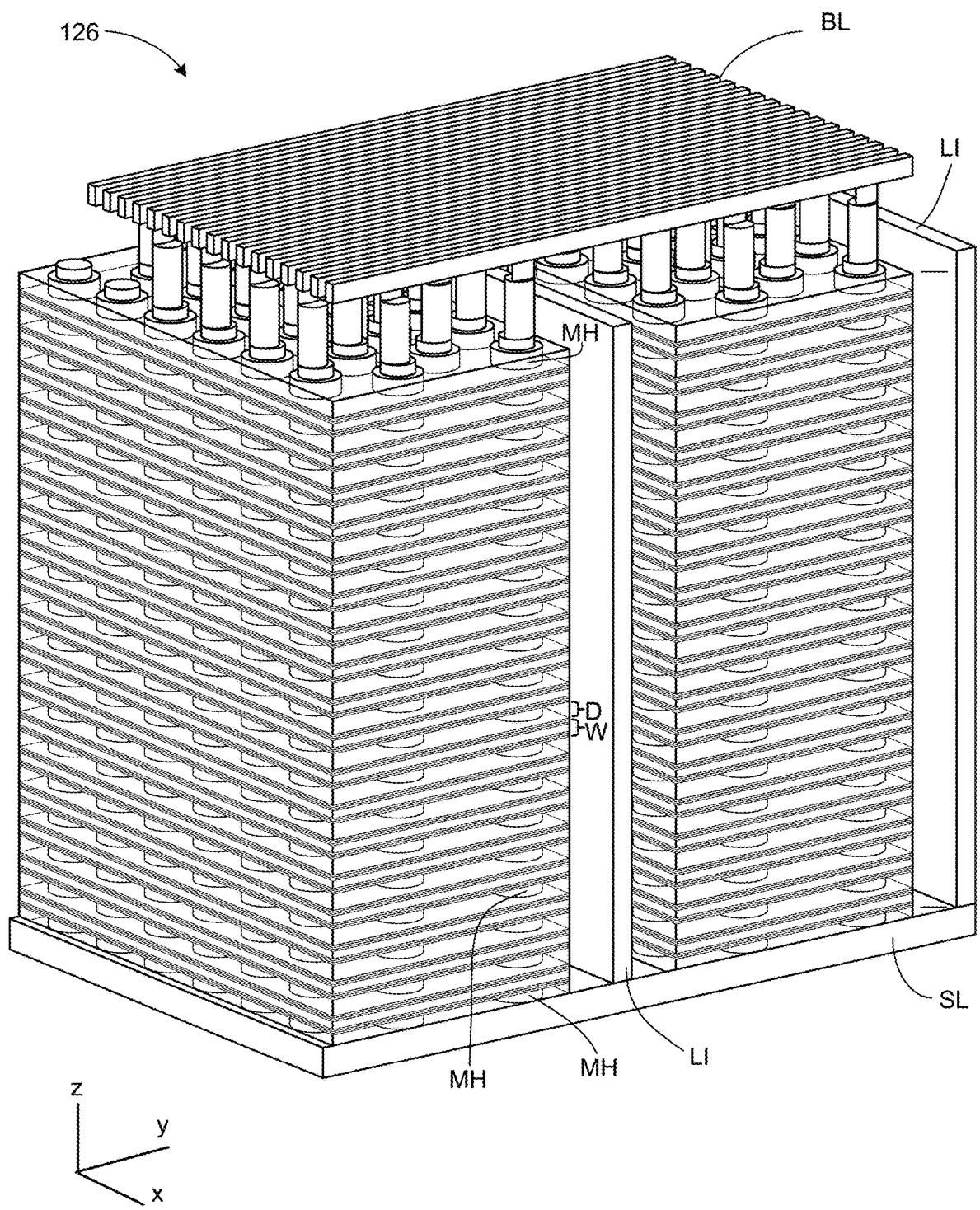
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126, which includes a plurality non-volatile memory cells. For example, FIG. 3 shows a portion of one block of memory. The structure depicted includes a set of bit lines BL positioned above a stack of alternating layers of dielectric material and conductive material on a substrate. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into "fingers" in regions that are separated by local interconnects LI. FIG. 3 shows two regions, each with respective NAND strings, and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 are provided below with respect to FIGS. 4A-4D.

FIG. 4A is a block diagram explaining one example organization of a memory structure (e.g., memory structure 126), which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines. Blocks may be connected by bit lines that are shared by multiple blocks.

Figure 4B:
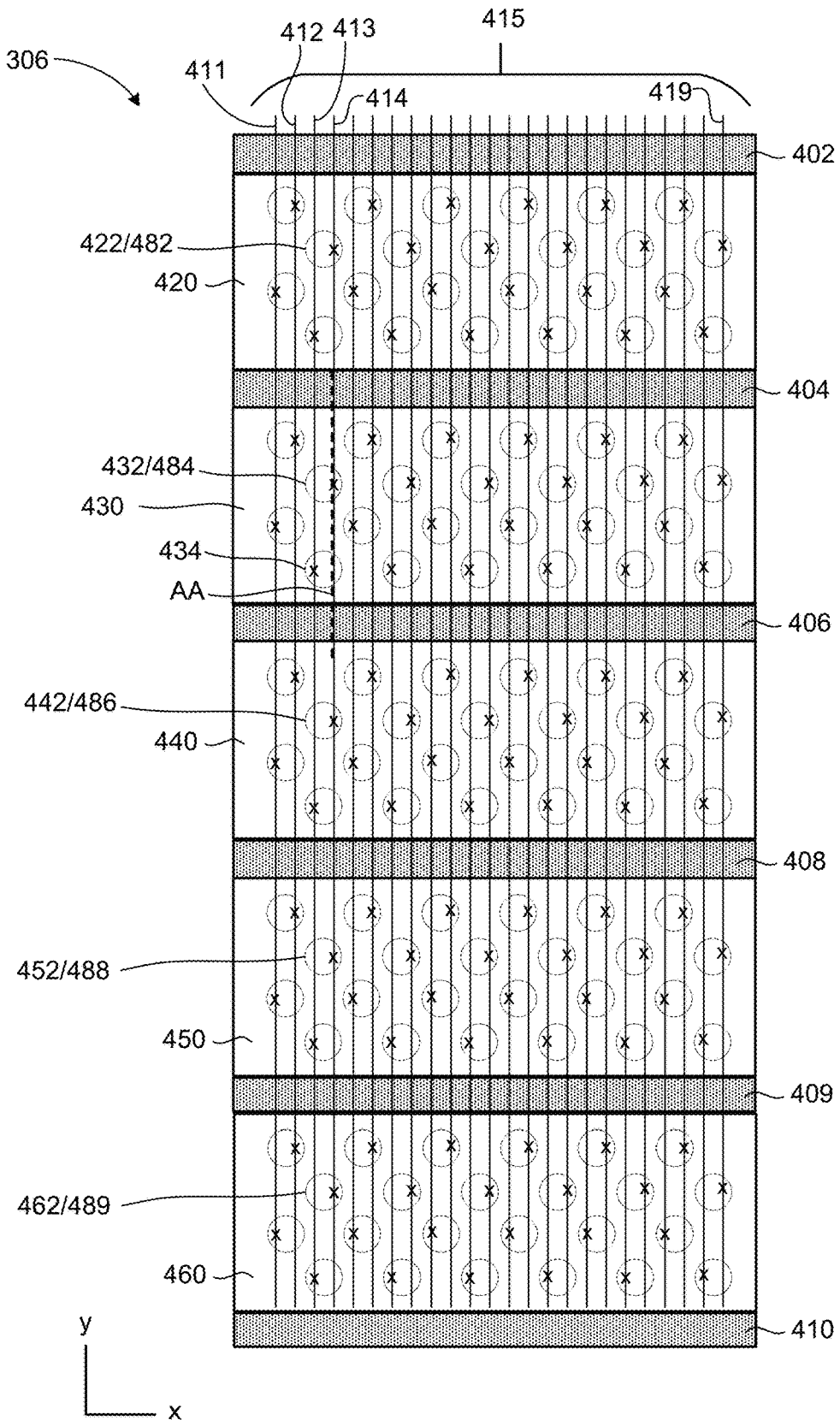
FIG. 4B depicts a top view of a portion of a block of memory cells.
Figure 4C:
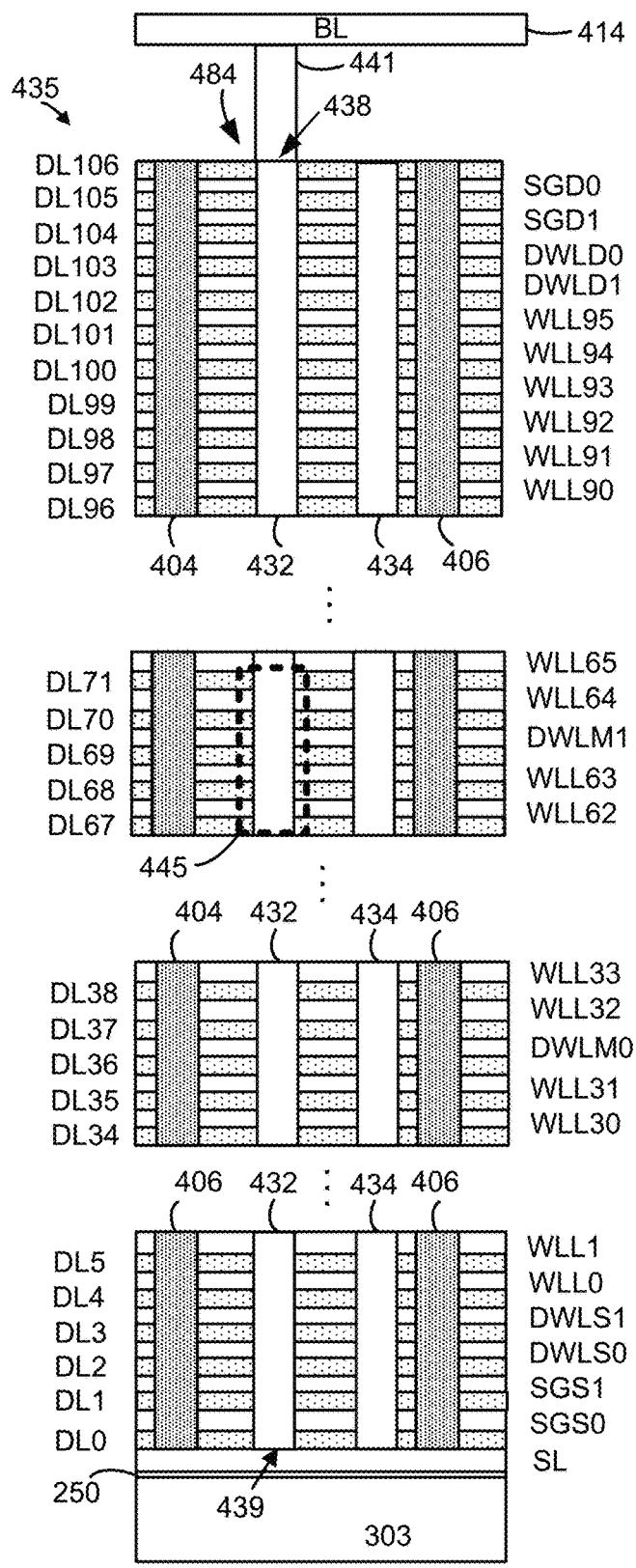
FIG. 4C depicts an embodiment of a stack showing a cross-sectional view along line AA of FIG. 4B.
Figure 4D:
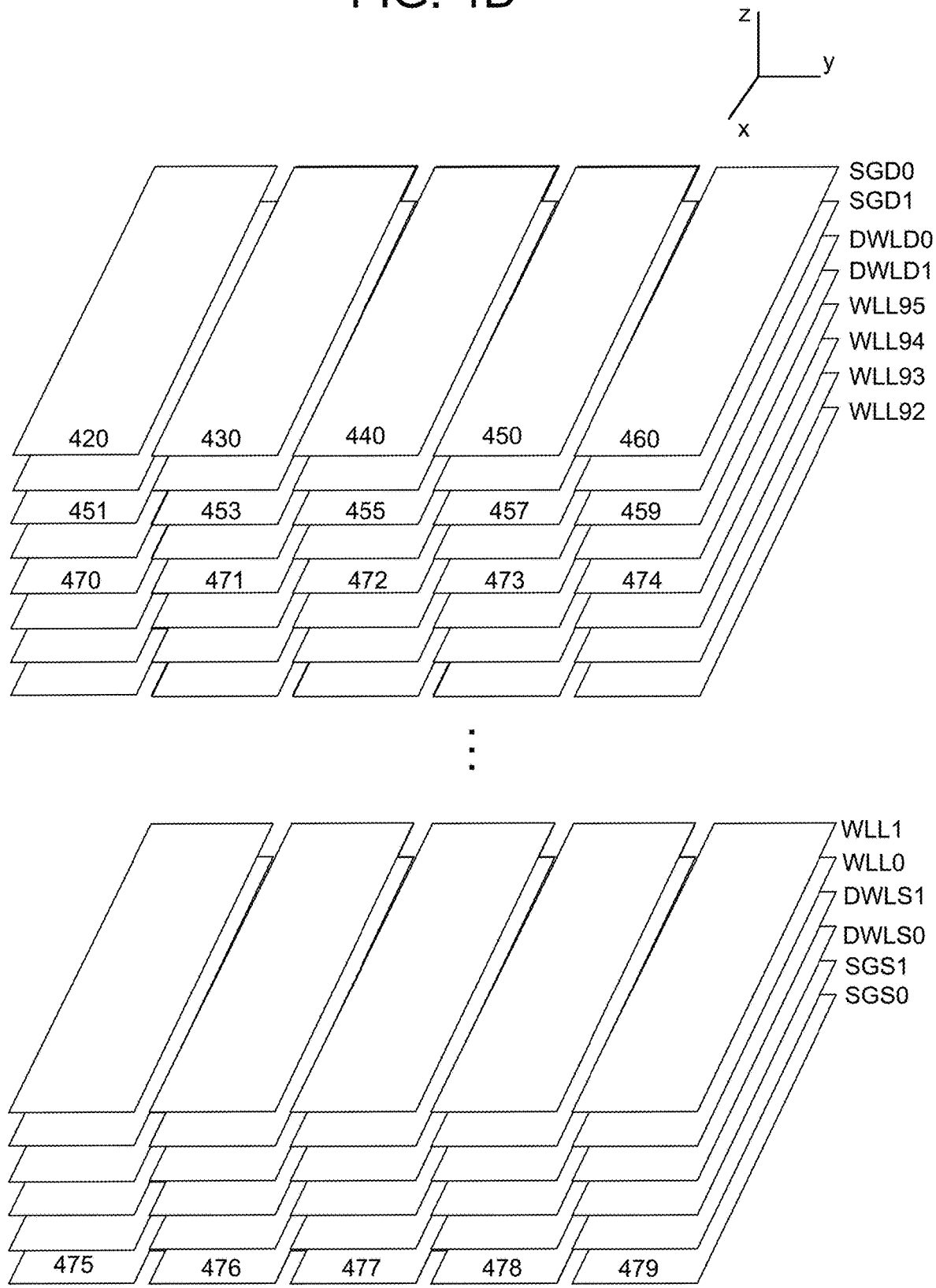
FIG. 4D depicts an alternative view of the select gate layers and word line layers of the stack 435 of FIG. 4C.

FIGS. 4B-4D depict an example three dimensional ("3D") NAND structure that corresponds to the structure of FIG. 3 and can be used to implement memory structure 126 of FIG. 2A or FIG. 2B. FIG. 4B is a block diagram depicting a top view of a portion of one block from memory structure 126. The portion of the block depicted in FIG. 4B corresponds to block portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 462. Vertical column 422 implements NAND string 482. Vertical column 432 implements NAND string 484. Vertical column 442 implements NAND string 486. Vertical column 452 implements NAND string 488. Vertical column 462 implements NAND string 489. More details of the vertical columns are provided below. The block depicted in FIG. 4B extends to include more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452 and 462 (one column, or NAND string, in each region).

The block depicted in FIG. 4B includes a set of local interconnects 402, 404, 406, 408, 409 and 410 that connect to a source line below the vertical columns. Local interconnects 402, 404, 406, 408, 409 and 410 also serve to divide each layer of the block into five regions; for example, the block depicted in FIG. 4B is divided into regions 420, 430, 440, 450 and 460, which are separated by local interconnects 402, 404, 406, 409 and 410, so that each layer is divided into portions which may be referred to as fingers. In the layers of the block that implement memory cells, the five portions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column, or NAND string, in each of regions 420, 430, 440, 450 and 460. In one embodiment, NAND strings of different regions that are connected to a common bit line may be connected to the same word line (via different word line fingers on the same level that are connected together); therefore, the system uses the source side selection lines and the drain side selection lines to choose one (or another subset) to be subjected to a memory operation (program, verify, read, and/or erase). A given bit line may connect to a fixed number of NAND strings in each block. For example, bit lines 415 each connect to five NAND strings in block portion 306 (e.g., bit line 414 connects to NAND strings 482, 484, 486, 488 and 489). When performing memory access operations (e.g., programming and reading), such strings may be accessed at different times. For example, when programming or reading memory cells in a given level of a block, programming may proceed sequentially from region to region (string to string). Thus, memory access operations may access some or all NAND strings in region 420 of the block at a first time, access some or all NAND strings in region 430 at a second time, access some or all NAND strings in region 440 at a third time, access some or all NAND strings in region 450 at a fourth time and access some or all NAND strings in region 460 at a fifth time. In other examples, fewer or more than five such regions may be provided in a block. The NAND strings in a region of a block may be referred to collectively for convenience when referring to access operations directed to parallel access to such NAND strings. For example, accessing NAND strings of region 420 may be referred to as accessing "String 1," accessing NAND strings of region 430 may be referred to as accessing "String 2," accessing NAND strings of region 440 may be referred to as accessing "String 3," accessing NAND strings of region 450 may be referred to as accessing "String 4" and accessing NAND strings of region 460 may be referred to as accessing "String 5."

FIG. 4B also shows the vertical columns being staggered. In other embodiments, different patterns of staggering can be used. In some embodiments, the vertical columns are not staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG portions in regions 420, 430, 440, 450 and 460 consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer portions 451, 453, 455, 457 and 459. A dummy memory cell, also referred to as a non-data memory cell, does not store data and is ineligible to store data, while a data memory cell is eligible to store data.

Below the dummy word line layers are the data word line layers. For example, WLL95 comprises word line layer regions 470, 471, 472, 473 and 474.

Below the data word line layers are the source-side dummy word line layers DWLS0 and DWLS1. Each source-side dummy word line can be independently controlled, in one approach (e.g., different voltages may be applied to DWLS0 and DWLS1). Alternatively, the source-side dummy word lines may be connected and commonly controlled (e.g., same voltage may be applied to DWLS0 and DWLS1)

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477, 478 and 479 as shown in FIG. 4D. Each SG line can be independently controlled, in one approach. Or the SG lines can be connected and commonly controlled.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Although the example memory system of FIGS. 3-4D is a three dimensional memory structure that includes vertical NAND strings with charge-trapping material, other (2D and 3D) memory structures can also be used with the technology described herein (e.g., other memory structures with NAND strings including a plurality of data memory cells coupled to a plurality of data word lines in series with a plurality of dummy memory cells connected to a plurality of dummy word lines). Different operations for accessing data in non-volatile memory cells (e.g., read, program, and program verify) that are described below may be applied to one or more of the example memory systems described above with respect to FIGS. 1-4D.

Typically, the program voltage applied to the control gates (via a selected word line) during a program operation is applied as a series of program pulses. Between programming pulses of program steps are a set of verify pulses to perform verification in verify steps (e.g., alternating program steps and verify steps in a program operation). In many implementations, the magnitude of the program pulses is increased with each successive pulse by a predetermined step size.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with an erased state so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

Figure 5A:
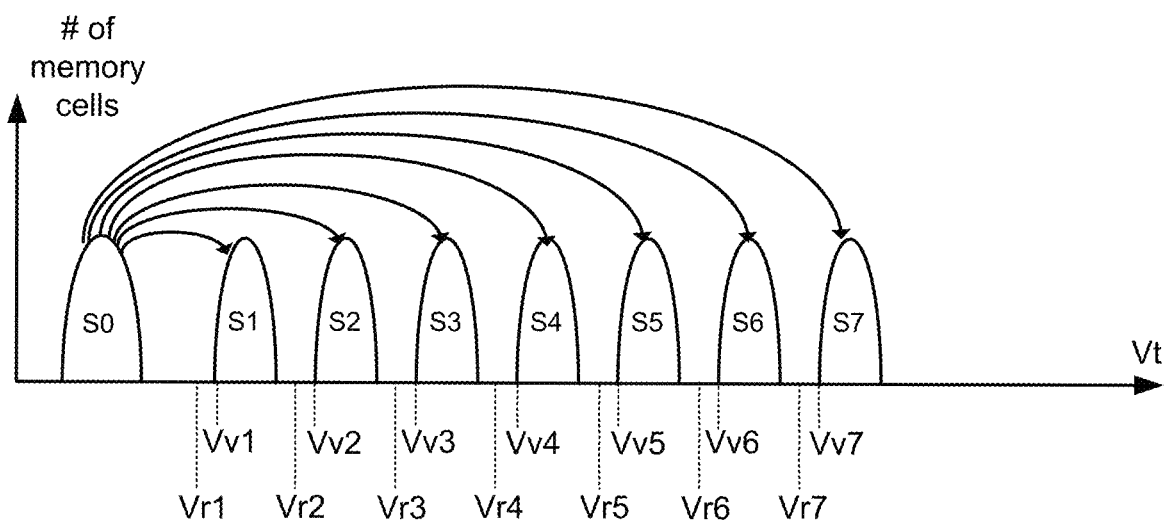
FIG. 5A illustrates aspects of programming operations according to an example.

FIG. 5A shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 used in read verify steps during a programming operation. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5A also shows Vev, which is a voltage level to test whether a memory cell has been properly erased (e.g., whether a memory cell is in the S0 data state).

In general, during sensing of verify and read operations, the selected word line is connected to a voltage (one example of a reference signal or read voltage), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5A) in order to sense whether a threshold voltage of the concerned memory cell has reached such level. After applying the read voltage to the word line, the conduction current of the memory cell is measured to determine whether the memory cell turned on (conducted current) in response to the voltage applied to the word line. If the conduction current is measured to be greater than a certain value (e.g., Isense), then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected data memory cells are provided with one or more read pass voltages (also referred to as bypass voltages) at their control gates so that these data memory cells will operate as pass gates (e.g., conducting current regardless of whether they are programmed or erased), select gates of selected NAND strings are provided with sufficient voltage (e.g., select voltages via select lines) to make corresponding select transistors conductive ("turn on") and dummy memory cells of selected NAND strings are provided with sufficient voltage (e.g., dummy word line voltage via dummy word lines) to make corresponding dummy memory cells conductive.

There are many ways to measure the conduction current of a memory cell during sensing in a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for sensing during verify or read operations. Other read and verify techniques known in the art can also be used.

Figure 5B:
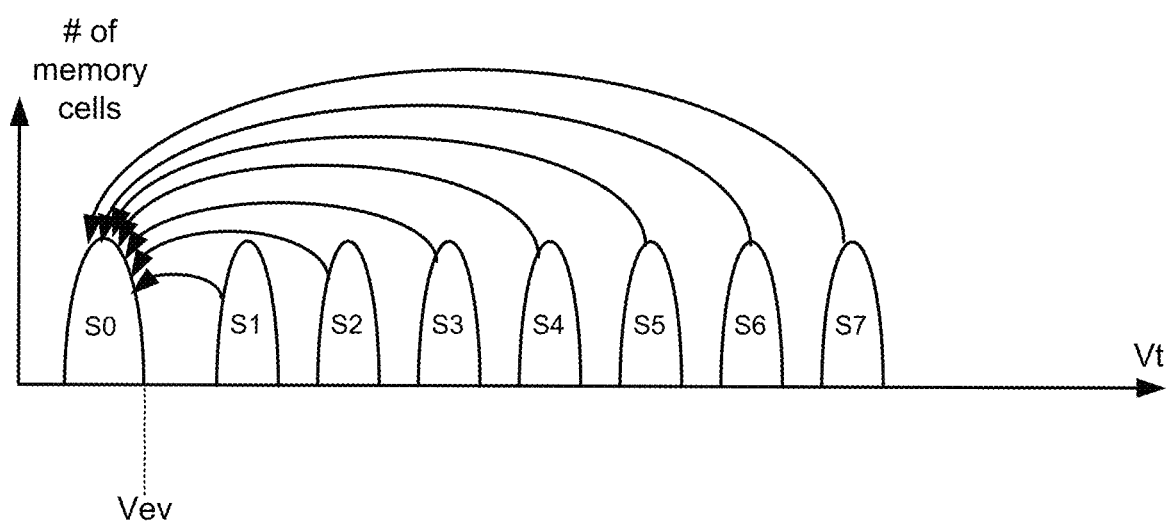
FIG. 5B illustrates aspects of erasing operations according to an example.

FIG. 5B shows an example of an erase operation in which charge is removed from memory cells of threshold voltage distributions for seven data states, S1 to S7, which results in all programmed memory cells being in erased state S0. Also shown is erase verify voltage, Vev for verifying memory cells are in state S0. In an example, a high voltage (erase voltage) is applied to word lines of a block to erase memory cells. For example, 20 volts may be used as an erase voltage while lower voltages may be used to program and read memory cells. Programming memory cells may use voltage pulses of different voltages and reading may apply different read voltages and read pass voltages to word lines. Additional voltages may be applied to dummy word lines, select lines and other components. Thus, a range of voltages may be used in various access operations (read, write and erase) directed to memory cells. In general, such voltages are not all directly supplied to a memory die (e.g., memory die 108) and may be generated on-chip. For example, memory die 108 may receive a supply voltage (e.g., 1.8 volts or 3.0 volts) and may generate different voltages (e.g., erase voltage, read voltages, program voltages) from the supply voltage using appropriate power circuits. An example of a circuit that may be used to generate a relatively high voltage (e.g., erase voltage) from a lower supply voltage is a charge pump.

FIGS. 6A to 6D provide example configurations of a charge pump (e.g., charge pump 117 in FIGS. 1 and 2B). A charge pump can use a capacitor to transfer charge from an input node to an output node.

Figure 6A:
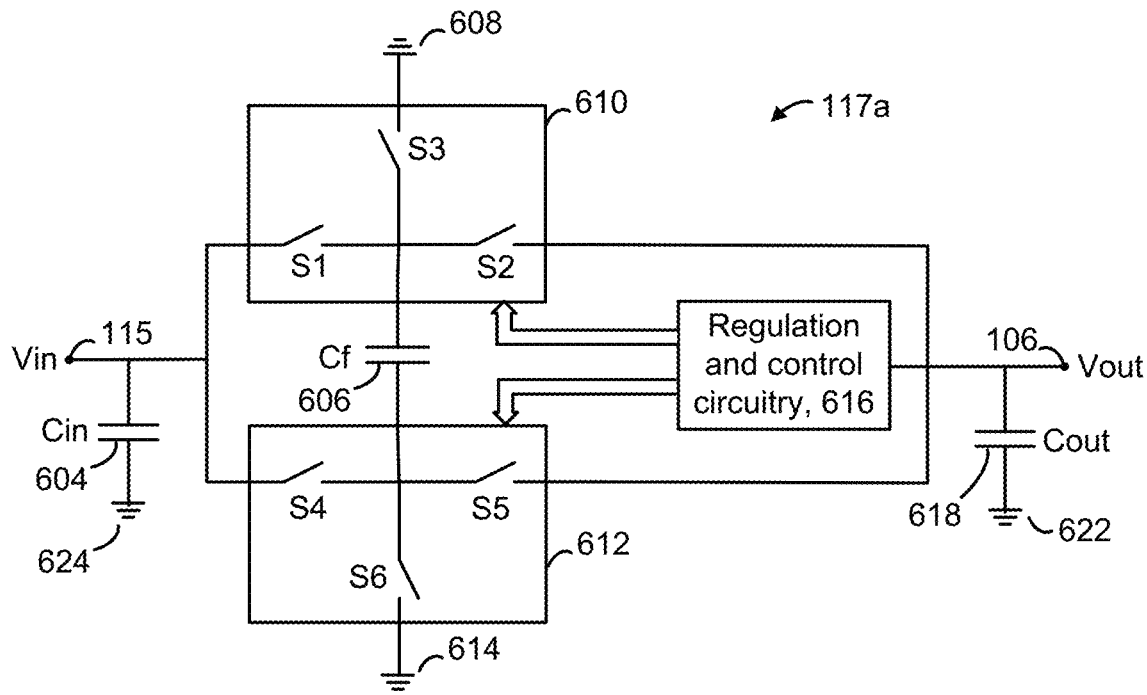
FIG. 6A depicts an example implementation of a charge pump configured as a single-stage charge pump.

FIG. 6A depicts an example implementation of the charge pump 117 configured as a single-stage charge pump 117a. A charge pump generally refers to a switching voltage converter that employs an intermediate capacitive storage element which is sometimes referred to as a flying capacitor or a charge transfer capacitor. One or more capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The principles discussed herein can be applied to one or more stages, and to one or more capacitors in a stage. The charge pump 117a is a generalized embodiment which can be controlled for multiplier, divider, inverter and follower applications. The charge pump 117a includes an input node 115 at which an input voltage (Vin) is applied. For example, Vin may be equal to a fixed power supply voltage sometimes referred to as Vdd or Vcc in a semiconductor chip. Or, Vin may be a clamped voltage which is lower than the power supply voltage, as in FIG. 1. Charge from the voltage is maintained in an input capacitor Cin 604 which is connected to a ground node 624.

A first set of switches 610 and a second set of switches 612 are controlled by regulation and control circuitry 616 to transfer charge from the input node 115 to a capacitor Cf 606, and from Cf 606 to an output node 106. Vout is a resulting voltage at the output node 106 and can be greater than or less than Vin. The output node is coupled to an output capacitor Cout 618, which is connected to a ground node 622. The first set of switches 610 includes switches S1, S2 and S3 which are star-connected to one terminal (such as the top conductor) of Cf. The switches may be MOSFETs, bipolar junction transistors, relay switches, or the like. S1 connects the top conductor of Cf 606 to the input node 115 to receive a charge from Vin. S2 connects the top conductor of Cf 606 to the output node 106 to transfer its charge to the output node. S3 connects the top conductor of Cf 606 to a ground node 608. Similarly, the second set of switches 612 includes switches S4, S5 and S6 which are star-connected to another terminal (such as the bottom conductor) of Cf 606. S4 connects the bottom conductor of Cf 606 to the input node 115 to receive a charge from Vin. S5 connects the bottom conductor of Cf 606 to the output node 106 to transfer its charge to the output node. S6 connects the bottom conductor of Cf 606 to a ground node 614.

Figure 6B:
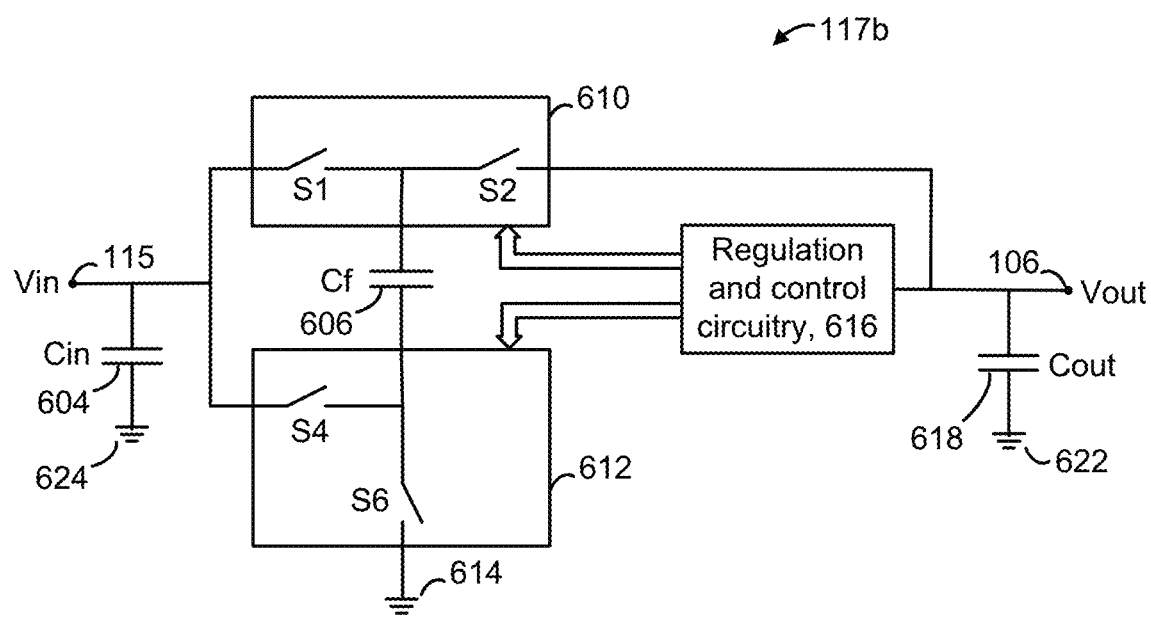
FIG. 6B depicts an example implementation of a charge pump configured as a voltage multiplier.

FIG. 6B depicts an example implementation of the charge pump 117 configured as a voltage multiplier 117$b$. A voltage multiplier, or step-up charge pump, in general, provides Vout>Vin. In this configuration, the voltage multiplier provides 2×Vin>Vout>Vin, and the switches S3 and S5 of FIG. 6A are not needed. In a charging phase, the regulation and control circuitry 616 provides the switches with appropriate control signals so that S1 is closed, e.g., conductive, and S2 is open, e.g., non-conductive, so that Cf 606 is charged via S1. Further, S4 is open and S6 is closed so that the bottom conductor of Cf 606 is connected to the ground node 614. In a discharging phase, S1 is open and S2 is closed, so that Cf 606 is discharged, at least in part, to the output node 106 via S2. Further, S4 is closed and S6 is open.

Figure 6C:
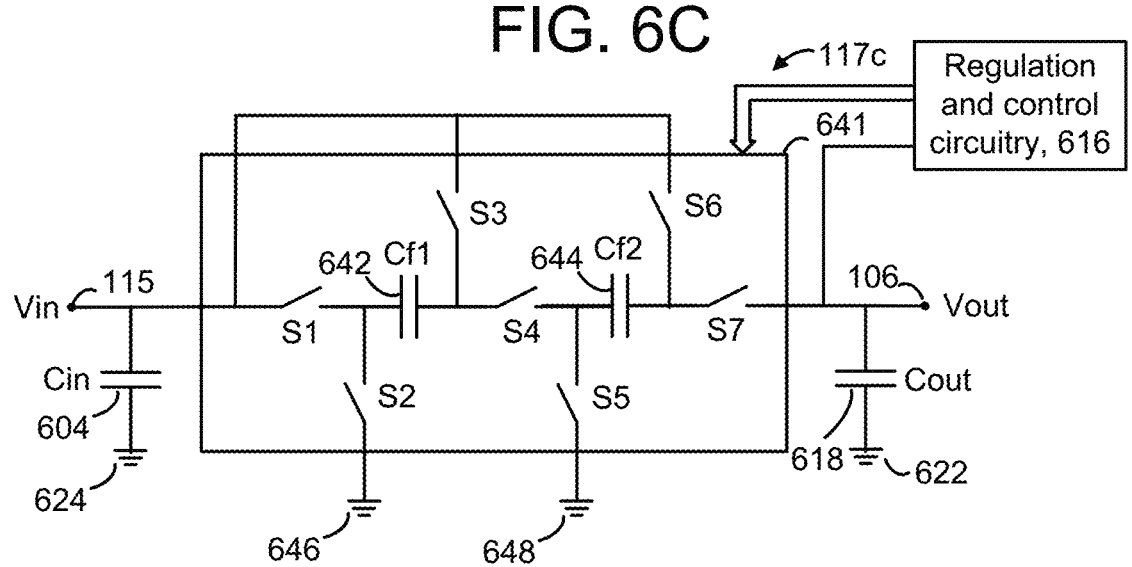
FIG. 6C depicts an example implementation of a charge pump configured as a single-stage, multi-capacitor charge pump.

FIG. 6C depicts an example implementation of the charge pump 117 configured as a single-stage, multi-capacitor charge pump 117$c$. In this example, multiple flying capacitors are provided in a single stage. While two capacitors are provided as an example, more than two may be used. There are many possible charge pump configurations with multiple flying capacitors. The charge pump 117$c$ is configured as a voltage multiplier in which Vout=3×Vin. Capacitors Cf1 642 and Cf2 644 are provided. A set of switches 641 includes switches S1 to S7. S2 and S5 are connected to ground nodes 646 and 648, respectively. During a charging phase, switches S2, S3, S5, and S6 are closed, while S1, S4 and S7 are open, so that both flying capacitors Cf1 and Cf2 are connected in parallel and charged to the input voltage. During a discharging phase, switches S1, S4 and S7 are closed, and S2, S3, S5 and S6 are open, so that the flying capacitors are connected in series between the input node 115 and the output node 106. This effectively creates an output voltage of approximately three times the input voltage.

The use of multiple flying capacitors in a single stage can provide a ratio between Vout and Vin, e.g., Vout=1.5×Vin, 3×Vin, etc., or Vout=1/2×Vin, 1/3×Vin, etc. For greater flexibility, a multi-stage charge pump, such as described below, can be used.

Figure 6D:
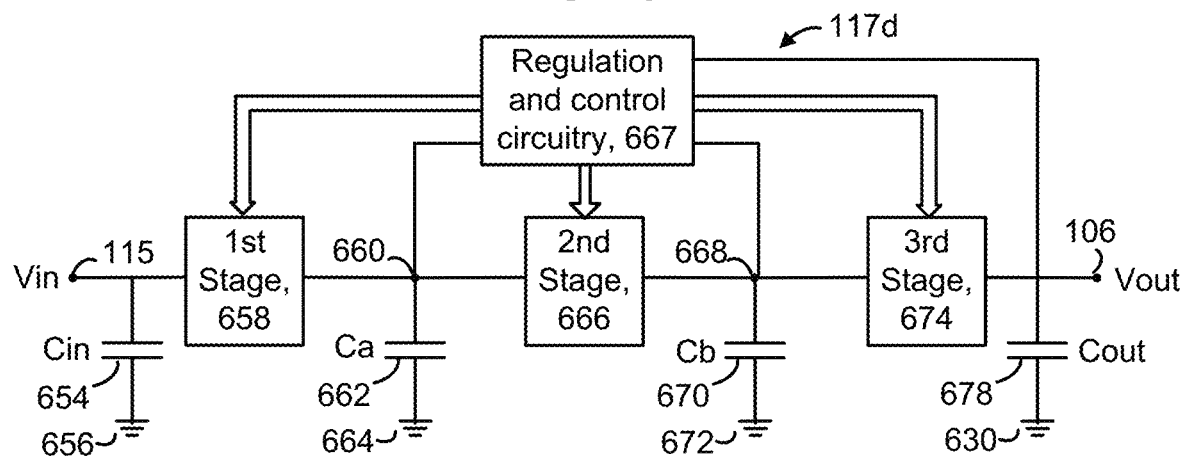
FIG. 6D depicts an example implementation of a charge pump configured as a multi-stage charge pump

FIG. 6D depicts an example implementation of the charge pump 117 configured as a multi-stage charge pump 117$d$. Vin is provided at input node 115 so that Vout is obtained at an output node 106. As an example, three stages 658, 666 and 674 are provided. Two or more stages may be used. Each stage can include switches and one or more flying capacitors as discussed previously, for example. At the input, a capacitor Cin 654 is connected at one of its conductive layers to a ground node 656. At a node 660 which is between the first stage 658 and the second stage 666, a capacitor Ca 662 is connected at one of its conductive layers to a ground node 664. At a node 668 which is between the second stage 666 and the third stage 674, a capacitor Cb 670 is connected at one of its conductive layers to a ground node 672. Finally, at the output node 106, an output capacitor Cout 678 is connected at one of its conductive layers to a ground node 630. A multi-stage charge pump can provide greater flexibility in terms of providing a greater range of output voltages. Further, each stage can include one or more capacitors to provide even greater flexibility.

The multi-stage charge pump 117$d$ is operated under the control of regulation and control circuitry 667 which controls switching in each stage. Note that it is also possible to provide regulation and control circuitry in each stage, additionally or alternatively. Charge is transferred from the input node 115 of the first stage to a flying capacitor (not shown) in the first stage 658, and from the flying capacitor of the first stage to the node 660. Charge is then transferred from the node 660 of the second stage to a flying capacitor (not shown) in the second stage, and from the flying capacitor of the second stage to the node 668. Charge is then transferred from the node 668 to a flying capacitor (not shown) in the third stage, and from the flying capacitor of the third stage to the output node 106, assuming there are no further stages.

Multiple capacitors are used in each of the example implementations of charge pump 117 illustrated in FIGS. 6A-D. The capacitors may be relatively large components that may occupy significant area on a die (e.g., a memory die). For example, charge pump 117 of FIG. 1 may occupy a large part of the area of power control circuit 116 (e.g., more than half) and may represent a significant portion of the area used for control circuits 110. Because such capacitors may occupy significant area, redundant capacitors may not be provided so that failure of a capacitor may cause result in a die failure.

Additional capacitors may be used for other purposes in a memory system. For example, capacitors may be connected to power nodes configured to supply power in a NAND die (e.g., Vcc, Vdd, Vdda). Such capacitors may be relatively large and may occupy a significant area (e.g., in a peripheral area of a NAND die).

In examples of the present technology, one or more capacitors may be formed in a stack of alternating layers of dielectric and conductive materials that is also used to form a memory structure. For example, a first portion of such a stack may form a plurality of blocks of NAND memory (e.g., as illustrated in FIGS. 3-4D). A second portion of such a stack may form a configurable capacitor structure. The configurable capacitor structure may be configurable to form one or more capacitors, which may have configurable capacitance. A control circuit may be connected to the configurable capacitor structure to configure it to provide a capacitor having a target capacitance or to provide multiple capacitors having multiple target capacitances. Such configurable capacitors may be used in a charge pump (e.g., any one or more of the capacitors illustrated in FIGS. 6A-D).

Figure 7A:
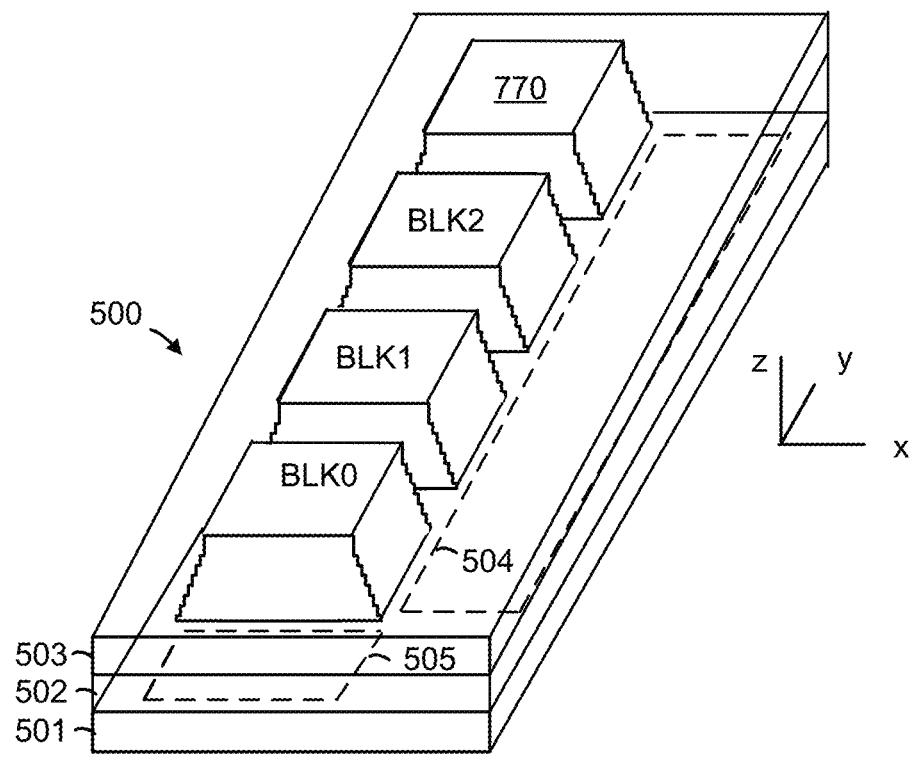
FIG. 7A shows an example of a stack on a substrate, a first portion of the stack forming a plurality of blocks of NAND memory, a second portion of the stack forming a configurable capacitor structure.

FIG. 7A is a perspective view that includes a set of blocks in an example 3D structure 500. On the substrate 501 are example blocks BLK0, BLK1 and BLK2 of memory cells (e.g., as shown in FIG. 3) and peripheral areas with circuitry for use by the blocks. The peripheral area 504 runs along an edge of each block while the peripheral area 505 is at an end of the set of blocks. The circuitry can include voltage drivers which can be connected to control gate (WL) layers, bit lines and source lines of the blocks and which may include charge pump circuitry (e.g., regulation and control circuitry 616, 667). The substrate 501 can also carry circuitry under the blocks (including charge pump circuitry), and may include one or more lower metal layers which are patterned in conductive paths to carry signals of the circuitry.

In addition, FIG. 7A shows a configurable capacitor structure 770, which is formed of a portion of the same stack of alternating layers of dielectric and conductive materials used to form BLK0, BLK1 and BLK2 on substrate 501. The blocks BLK0, BLK1, BLK2 and configurable capacitor structure 770 are formed in an intermediate region 502 of structure 500. In an upper region 503 of the structure, one or more upper metal layers are patterned in conductive paths to carry signals of the circuitry. Blocks BLK0, BLK1 and BLK2 are formed in a first portion of the stack in intermediate region 502 and configurable capacitor structure 770 is formed in a second portion of the stack in intermediate region 502. In one possible approach, each block has opposing tiered sides from which vertical contacts extend upward to an upper metal layer to form connections to conductive paths. Similarly, configurable capacitor structure 770 may be formed with at least one tiered side from which vertical contacts extend upward to an upper metal layer to form connections to conductive paths. While three blocks are depicted as an example, any number of blocks can be used, extending in the x- and/or y-directions. While a single configurable capacitor structure 770 that is equal in size to one block is shown, more than one configurable capacitor structure may be provided and the size of such a configurable capacitor structure is not limited to the size of a block. For example, a configurable capacitor structure may occupy less volume than an entire block (e.g., fewer than all possible layers in a stack and/or fewer than all fingers) or may occupy more than a single block (e.g., two blocks, three blocks, or more).

Figure 7B:
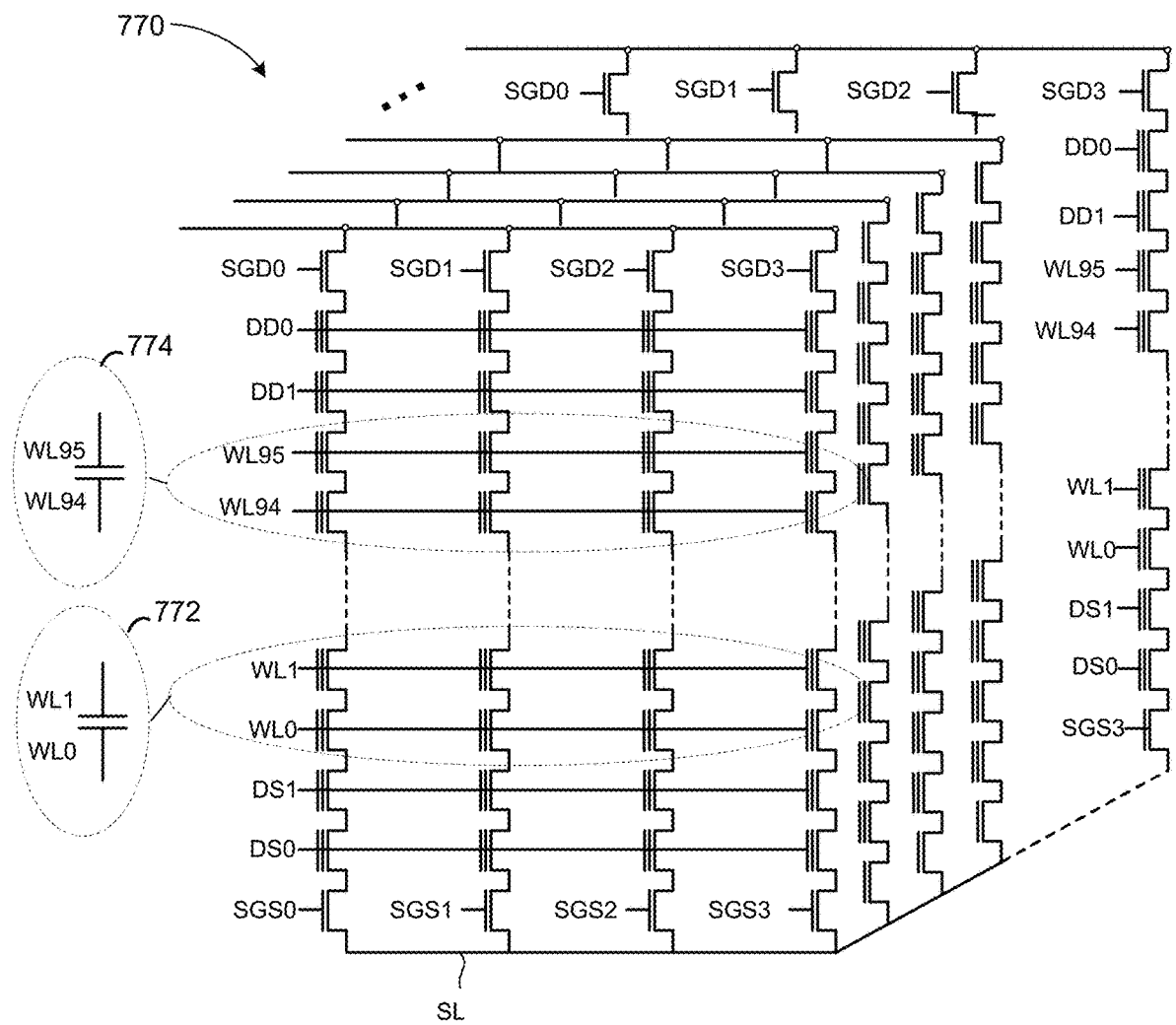
FIG. 7B shows an example configuration of word line layers in a configurable capacitor structure.

FIG. 7B illustrates a schematic of a portion of configurable capacitor structure 770 that is similar to a NAND flash memory block (e.g., a portion of memory structure 126 as illustrated in FIG. 3). Components are labeled as WLs, DLs, etc. as before and may be formed from the same conductive layers used to form corresponding word lines and dummy word lines. However, in configurable capacitor structure 770, these components are not used as word lines, dummy word lines, etc. as described with respect to memory structure 126. Instead, they are used to form electrodes (plates) of one or more capacitor. Any two adjacent portions of a word line layer may form a capacitor as illustrated. For example, WL0 and WL1 may form a capacitor 772 and WL94 and WL95 may form a capacitor 774 (both shown in simplified schematic form on the left). Any two such adjacent portions of word line layers may form a capacitor so that the stack of 96 data word line layers shown may form 48 capacitors. Additionally, adjacent dummy word line layers may form capacitors (e.g., DS0 and DS1 may form a capacitor, DD0 and DD1 may form a capacitor). In an example, a stack of alternating layers of dielectric and conductive materials that includes N layers of conductive material (e.g., used to form N layers of word lines and dummy word lines) may form a stack of up to N/2 capacitors. In some examples, such capacitors may be used as capacitive elements to form larger capacitive units in a configurable capacitor structure. Advantageously, such a configurable capacitor structure may be formed on the same die, from the same layers of dielectric and conductive materials as a NAND structure (e.g., memory structure 126 of BLK0, BLK1 and BLK2).

Figure 7C:
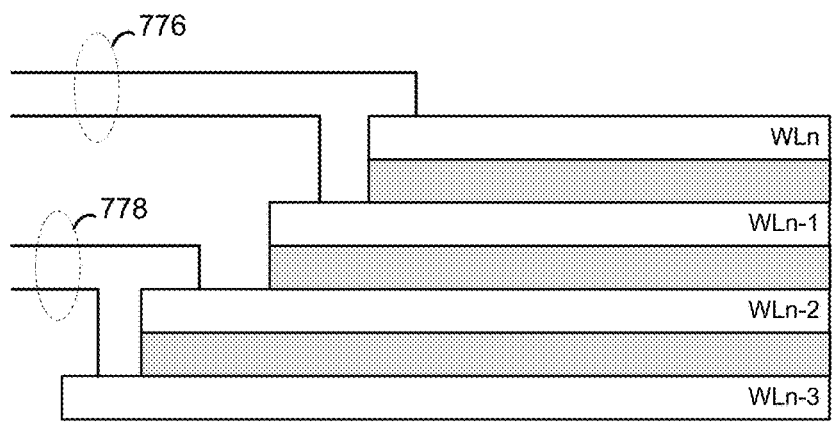
FIG. 7C shows an example of connection of word line layers in a configurable capacitor structure.

Connection to capacitor electrodes (plates) may be made in an edge region where layers are stepped to allow connection. FIG. 7C shows an example of a portion of an edge region of a stack of alternating layers of dielectric and conductive materials of configurable capacitor structure 770 where electrical connections are formed. For example, conductive lines 776 are connected to WLn and WLn-1, which are configured as electrodes of a capacitor. Conductive lines 778 are connected to WLn-2 and WLn-3, which are configured as electrodes of another capacitor. Conductive lines connected to such electrodes may be connected together in various ways to thereby form larger capacitive units.

Figure 8A:
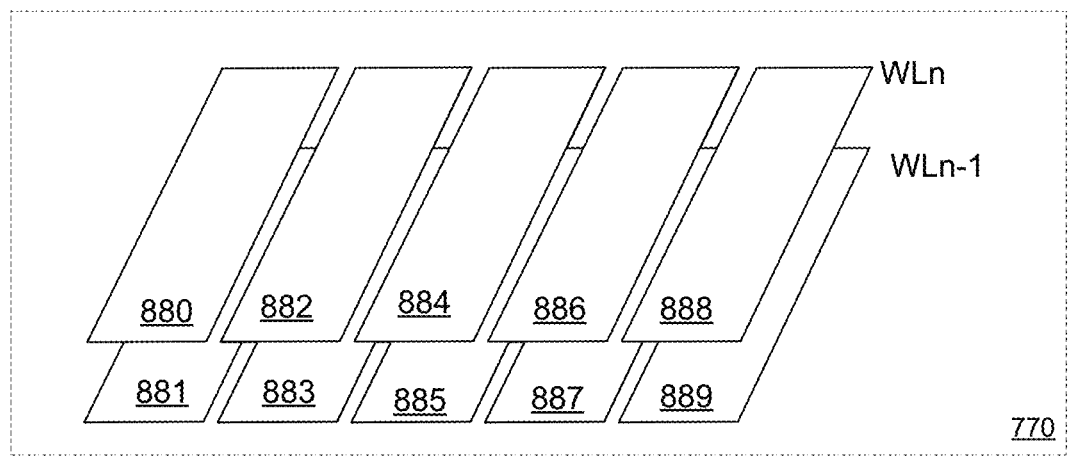
FIGS. 8A-B illustrate capacitive elements having electrodes formed of word line elements in a stack.

In some cases, conductive layers in a block are divided into two or more portions (e.g., as illustrated in FIG. 4D). Conductive layers in a configurable capacitor structure may be similarly divided in some cases. FIG. 8A shows an example of two layers of conductive material labeled as WLn and WLn-1, which may form word lines in a first portion of a stack (not shown) and may form capacitor electrodes in a second portion of the stack in configurable capacitor structure 770. WLn is divided into five portions 880, 882, 884, 886 and 888. WLn-1 is divided into five portions 881, 883, 885, 887 and 889. Each portion 880-889 forms an electrode of a capacitor, which may form a capacitive element in a larger capacitor structure formed of multiple capacitive elements.

Figure 8B:
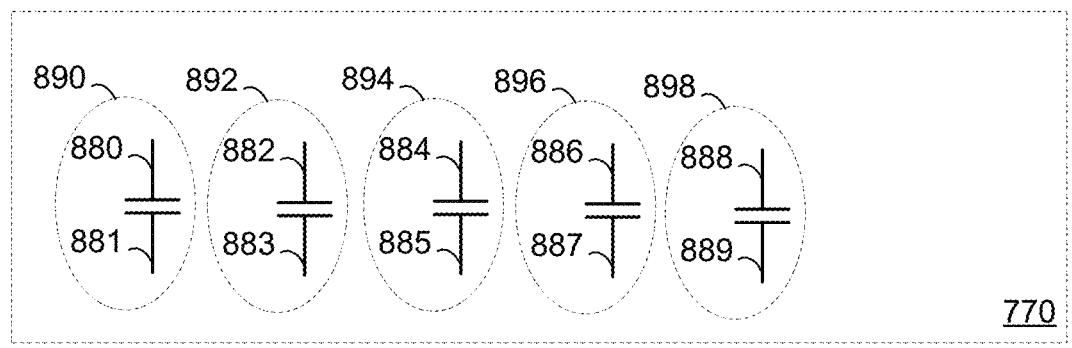

FIG. 8B illustrates capacitive elements formed in portions of common layers WLn and WLn-1 schematically. FIG. 8B includes capacitive element 890 formed of portion 880 of WLn and portion 881 of WLn-1, capacitive element 892 formed of portion 882 of WLn and portion 883 of WLn-1, capacitive element 894 formed of portion 884 of WLn and portion 885 of WLn-1, capacitive element 896 formed of portion 886 of WLn and portion 887 of WLn-1, and capacitive element 898 formed of portion 888 of WLn and portion 889 of WLn-1. Capacitive elements (e.g., capacitive elements 890, 892, 894, 896, 898) may be connected to form a larger capacitive unit in various ways (e.g., in parallel, in series, or in some combination of series and parallel). Any number of capacitive units may be connected to form a capacitive unit and the number of capacitive elements connected to form a capacitive unit is not limited to five.

Figure 9A:
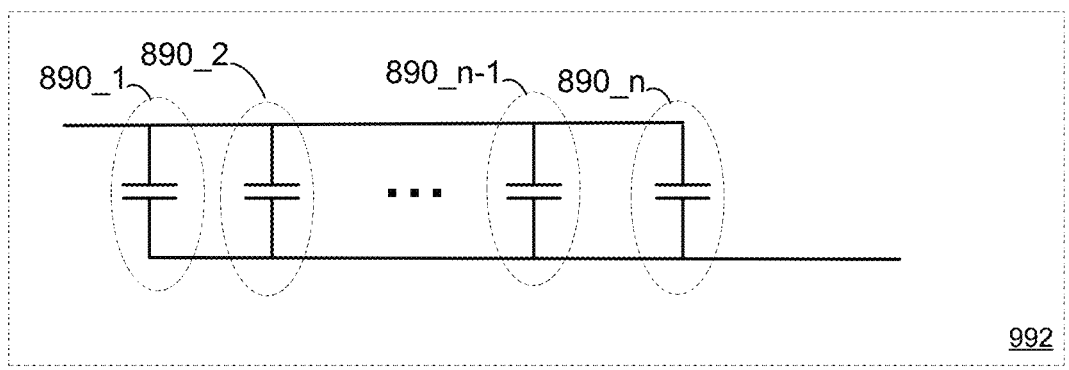
FIGS. 9A-C show examples of how capacitive elements may be connected in capacitive units.

FIG. 9A illustrates an example of n capacitive elements $890\_1$ to $890\_n$ (e.g., five capacitive elements 890, 892, 894, 896, 898), connected in parallel to form a capacitive unit 992. Because capacitive elements are connected in parallel in this example, the capacitance of capacitive unit 992 is the sum of the individual capacitances of the capacitive elements. Thus, where each capacitive element $890\_1$ to $890\_n$ has a capacitance Cce, the capacitance, Ccu, of capacitive unit 992 is the sum of n capacitances of capacitance Cce each, according to the formula:

$$Ccu = n*Cce. \qquad \text{(Equation 1)}$$

While in the above example all capacitive elements have the same capacitance, Cce, in other examples, different capacitive elements may have different capacitances such as Cce1, Cce2 ... Ccen. In such examples, the capacitance of a capacitive unit, Ccu, is the sum of the individual capacitances and may be expressed according to the formula:

$$Ccu = Cce1 + Cce2 + \ldots Ccen \qquad \text{(Equation 2)}$$

Figure 9B:
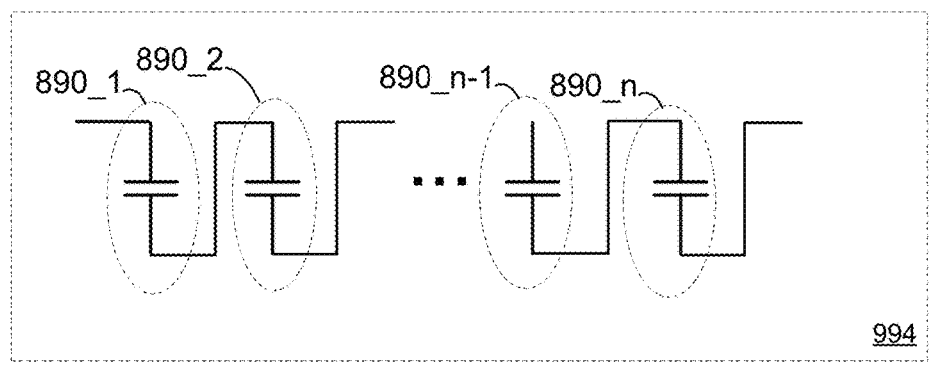

FIG. 9B illustrates an example of n capacitive elements $890\_1$ to $890\_n$ (e.g., five capacitive elements 890, 892, 894, 896, 898), connected in series to form a capacitive unit 994. Because capacitive elements are connected in series in this example, the capacitance of capacitive unit 994 is less than the capacitance of an individual capacitive unit. Where each capacitive element 890_1 to 890_n has a capacitance Cce, the capacitance of capacitive unit 994, which includes n capacitive elements of capacitance Cce each, is given by the formula:

$$Ccu = \frac{1}{n*\left(\frac{1}{Cce}\right)} \quad \text{(Equation 3)}$$

While in the example of Equation 3 all capacitive elements have the same capacitance, Cce, in other examples, different capacitive elements may have different capacitances such as Cce1, Cce2 . . . Ccen. In such examples, the capacitance of a capacitive unit, Ccu, may be expressed by the formula:

$$Ccu = \frac{1}{\left(\frac{1}{Cce1} + \frac{1}{Cce2} + \ldots \frac{1}{Ccen}\right)} \quad \text{(Equation 4)}$$

Figure 9C:
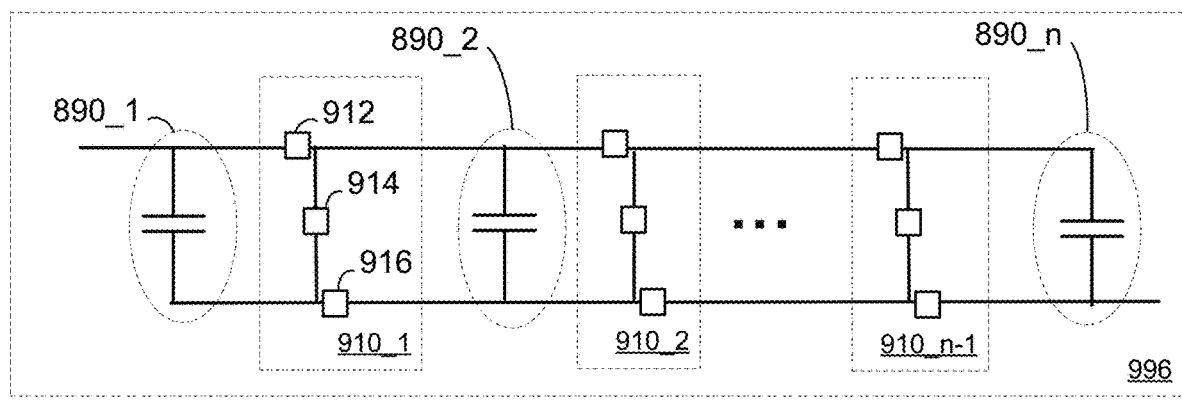

FIG. 9C illustrates an example of n capacitive elements 890_1 to 890_n (e.g., five capacitive elements 890, 892, 894, 896, 898), connected in a configurable arrangement to form a configurable capacitive unit 996. Configurable capacitive unit 996 includes sets of switches 910_1, 910_2, 910_n−1 between capacitive elements to allow connection of capacitive elements in parallel, in series, or in a combination of series and parallel. For example, set of switches 910_1, which includes top switch 912, middle switch 914 and bottom switch 916, is located between capacitive element 890_1 and 890_2 and allows capacitive element 890_1 and 890_2 to be connected in parallel by opening middle switch 914 and closing top switch 912 and bottom switch 916. Some or all capacitive elements of configurable capacitive unit 996 may be connected in parallel by similarly opening a middle switch and closing top and bottom switches of one or more sets of switches 910_2 to 910_n−1 (e.g., to obtain a configuration similar to that shown in FIG. 9A). Set of switches 910_1 also allows capacitive element 890_1 and 890_2 to be connected in series by closing middle switch 914 and opening top switch 912 and bottom switch 916. Some or all capacitive elements of configurable capacitive unit 996 may be connected in series by similarly closing a middle switch and opening top and bottom switches of one or more sets of switches 910_2 to 910_n−1 (e.g., to obtain a configuration similar to that shown in FIG. 9B). Sets of switches (e.g., sets of switches 910_1 to 910_n−1) may be considered means for selectively configuring the plurality of capacitive elements (e.g., capacitive elements 890_1 to 890_n) of a configurable capacitive unit in series to have a first capacitance and in parallel to have a second capacitance.

In an example of the present technology, capacitive units each include two or more capacitive elements formed in a common pair of layers (e.g., WLn and WLn-1). Individual capacitive units formed in different pairs of layers (e.g., WLn-2 and WLn-3, WLn-4 and WLn-5, WLn-6 and WLn-7, and so on) may be selectively connected together to form a capacitor of configurable capacitance. The capacitance of such a capacitor may depend on the number of such configurable units that are selected (and internal configuration of one or more configurable capacitive unit where provided). In other examples, capacitive elements formed in different pairs of layers (e.g., WLn/WLn-1 and WLn-2/WLn-3) may be connected together to form a capacitive unit and the present technology is not limited to capacitive units formed in a common pair of layers.

Figure 10:
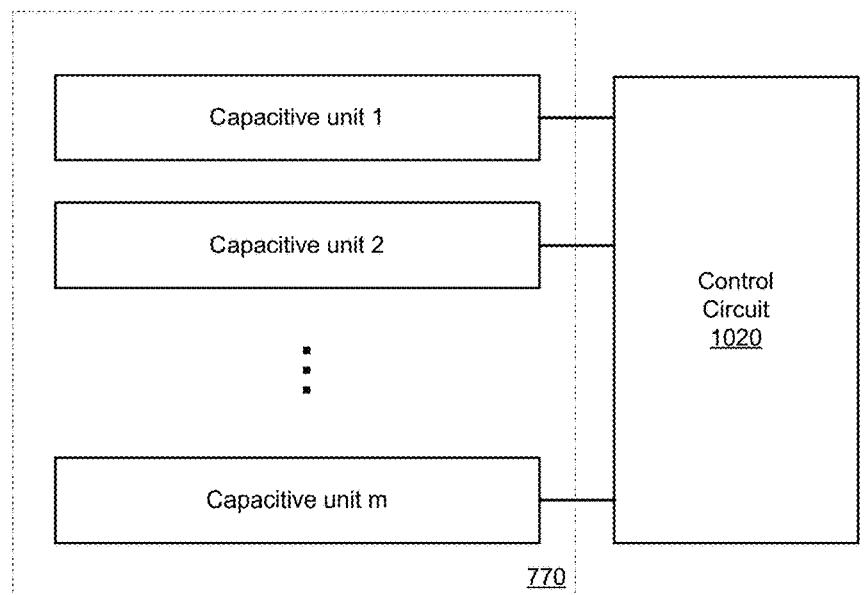
FIG. 10 shows an example of a configurable capacitor structure that includes m capacitive units.

FIG. 10 shows an example in which configurable capacitor structure 770 includes m separately selectable capacitive units (capacitive units 1-m), which may each be configured similarly (e.g., according to one of the configurations illustrated in FIGS. 9A-B) or may be differently configured (e.g., mixed configuration, which may include one or more capacitive unit having capacitive elements connected in parallel, one or more capacitive unit having capacitive elements connected in series, and/or one or more capacitive unit having capacitive elements connected in a mixed parallel/series configuration). Capacitive units 1-m of configurable capacitive structure 770 are connected to control circuit 1020, which may be configured to connect selected capacitive units to form a capacitor of configurable capacitance. For example, control circuit 1020 may connect from one capacitive unit to m capacitive units in parallel to form a capacitor with a capacitance from Ccu to m*Ccu, where Ccu is the capacitance of a capacitive unit. Control circuit 1020 may additionally control capacitance by configuring one or more configurable capacitive unit (e.g., as illustrated in FIG. 9C) to obtain a desired capacitance (e.g., parallel, series or mixed configuration of a capacitive unit). Control circuit 1020 may be formed in a peripheral area (e.g., peripheral area 504, 505) on the same die as configurable capacitor structure 770 or on a separate die.

Control circuit 1020 may be configured to detect that one or more capacitive units 1-m in the configurable capacitor structure 770 is defective and to connect only capacitive units that are not defective to form a capacitor (e.g., a short circuit may occur between two electrodes in a capacitive unit). For example, defective capacitive units may be identified during test and subsequently control circuit 1020 may detect defective capacitive units from test results. Alternatively, control circuit 1020 may perform testing of capacitive units by detecting a short circuit during initialization or at some later time. Defective capacitive units may be marked as defective (e.g., using a fuse, anti-fuse, flag, or other indicator) and may subsequently be omitted when forming a capacitor. In some cases, when a failure of a capacitor occurs during the lifetime of a product (e.g., after some period of use), the capacitor may be reconfigured to replace a capacitive unit that is identified as defective with another capacitive unit that is not defective (e.g., redundant capacitive unit). In a configurable capacitor structure, one or more capacitive unit may be considered as a redundant capacitive unit that is not initially configured as part of a capacitor and remains available to use in case of failure of a capacitive unit during the lifetime of the product.

Figure 11A:
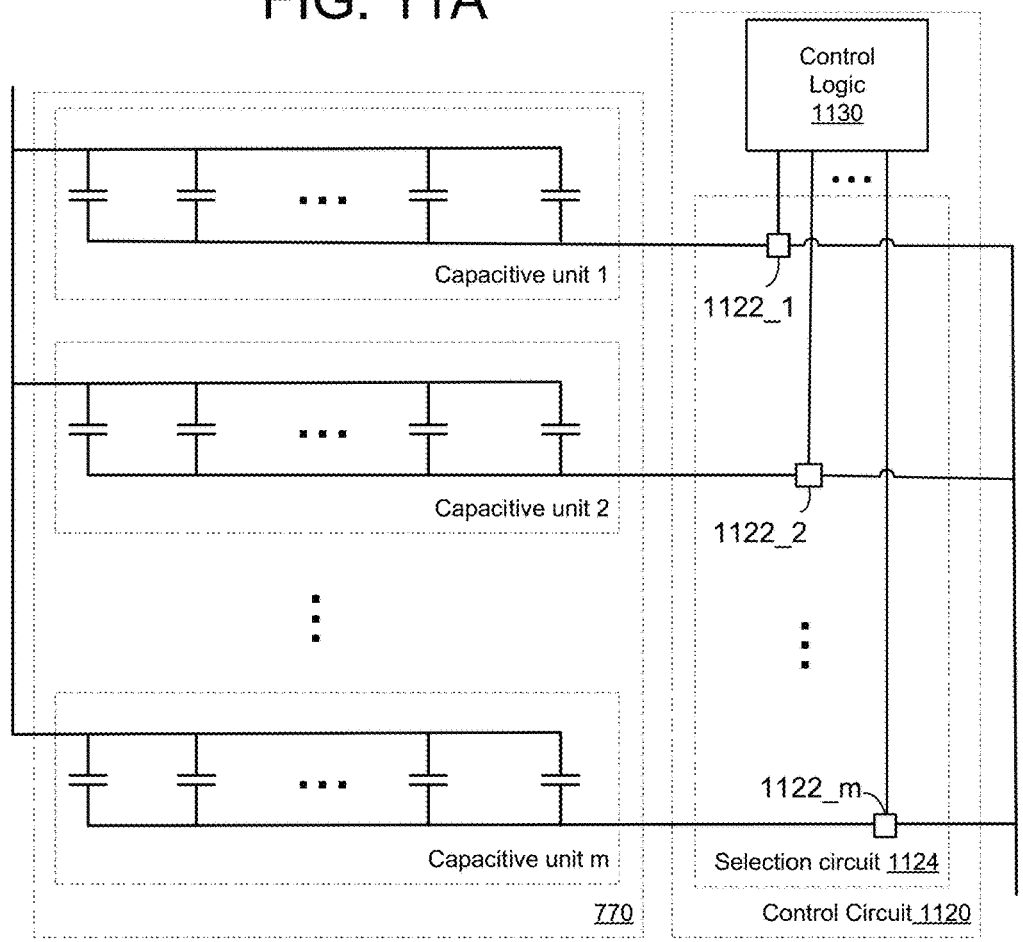
FIGS. 11A-C illustrate configurable capacitor structures having different capacitive unit configurations.

FIG. 11A shows an example of capacitive units 1-m each configured with capacitive elements connected in parallel as previously described with respect to FIG. 9A. Control circuit 1120 is shown as including selection circuit 1124, which includes m switches, 1122_1 to 1122_m that enable selective connection of corresponding capacitive units. Switches 1122_1 to 1122_m of selection circuit 1124 are controlled by control logic 1130 (e.g., control logic 1130 may select a selected number of switches to obtain a target capacitance). Up to m capacitive units may be connected together in parallel by selecting one or more of switches 1122_1 to 1122_m to form a capacitor in this arrangement. Defective capacitive units may be omitted. The resulting capacitor may have a capacitance value that is a multiple of the capacitance of an individual capacitive unit, Ccu. Each capacitive unit has a capacitance that is the sum of the capacitances of the individual capacitive elements in (e.g., n*Cce) in this arrangement so that the total capacitance may be up to m*n*Cce.

Figure 11B:
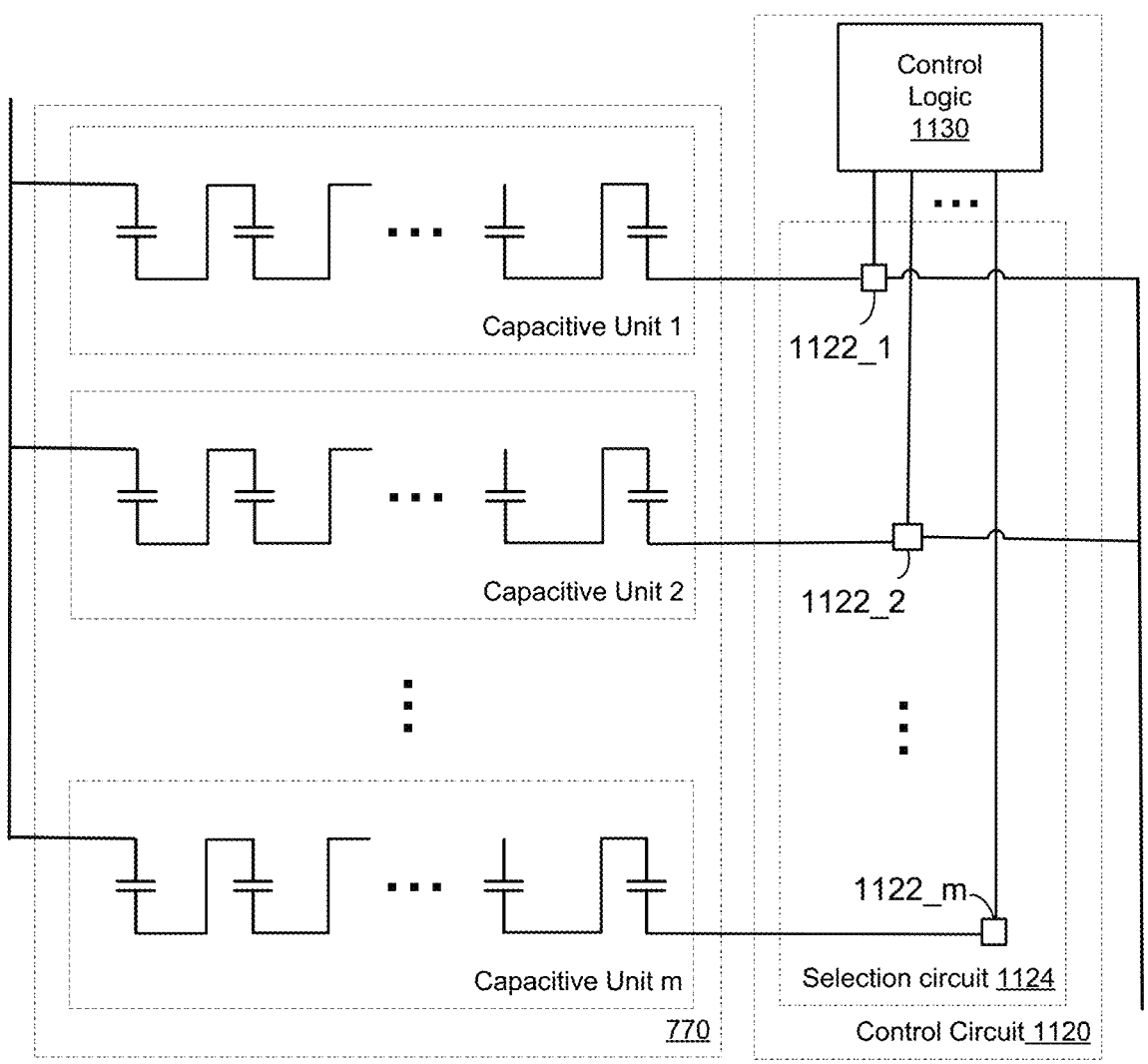

FIG. 11B shows an example of capacitive units 1-*m* each configured with capacitive elements connected in series as previously described with respect to FIG. 9B. Control circuit 1120 is shown as including selection circuit 1124, which includes m switches, 1122_1 to 1122_*m*, which are controlled by control logic 1130. Up to m capacitive units may be connected together in parallel by selecting one or more of switches 1122_1 to 1122_*m* to form a capacitor in this arrangement. Defective capacitive units may be omitted. The resulting capacitor may have a capacitance value that is a multiple of the capacitance of an individual capacitive unit, Ccu (e.g., as given by Equation 2 above).

Figure 11C:
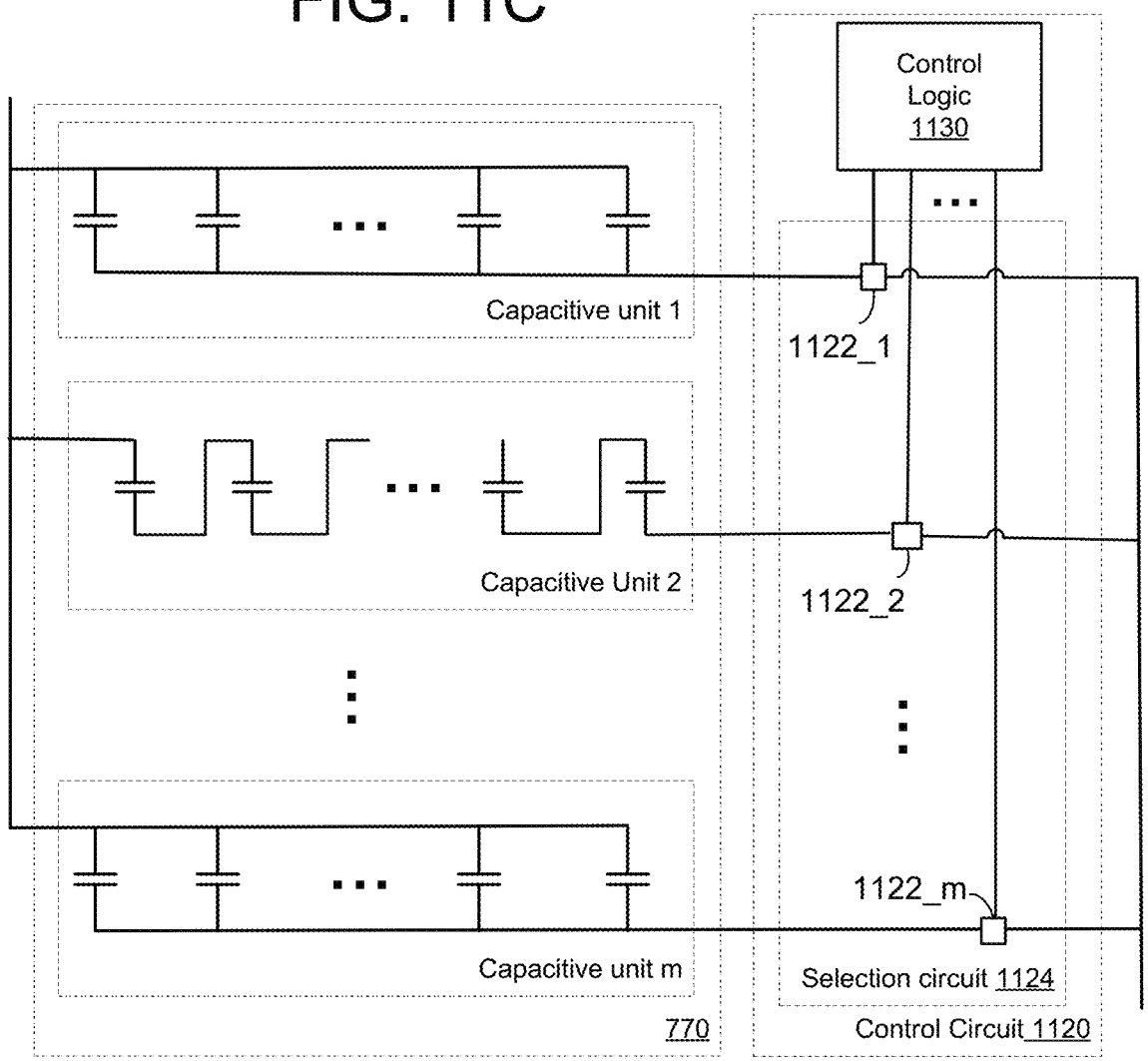

FIG. 11C shows an example of capacitive units 1-*m* in a mixed configuration, with some capacitive units configured with capacitive elements connected in parallel and other capacitive units configured with capacitive elements connected in series. Control circuit 1120 is shown as including selection circuit 1124, which includes m switches, 1122_1 to 1122_*m*, which are controlled by control logic 1130. Up to m capacitive units may be connected together in parallel by selecting one or more of switches 1122_1 to 1122_*m* to form a capacitor in this arrangement. The resulting capacitor may have a capacitance value that is the sum of the different capacitances of the capacitive units in this arrangement. For example, where a capacitive unit with capacitive elements connected in parallel (e.g., capacitive unit 1) has a first capacitance, C1, and a capacitive unit with capacitive elements connected in series (e.g., capacitive unit 2) has a second capacitance, C2, control circuit 1120 may select x capacitive units with parallel configuration and y capacitive units with series configuration to form a capacitor with a capacitance $C=x*C1+y*C2$. This may allow formation of capacitors having a wide range of capacitance and allow fine tuning of capacitance.

While capacitive units in any of FIGS. 11A-C may have fixed configuration (e.g., parallel or series), one or more capacitive unit may be a configurable capacitive unit (e.g., as shown in FIG. 9C) that can be reconfigured as needed. For example, capacitive unit 1 of FIG. 11C may be configurable to operate in parallel (as shown) or in series. Similarly, capacitive unit 2, may be configurable to operate in series (as shown) or in parallel. Including one or more such configurable capacitive unit in a configurable capacitor structure may provide flexibility in configuration. Control logic 1130 may control operation of sets of switches in any such configurable capacitive unit.

While the examples of FIGS. 11A-C show control circuit 1120 controlling capacitive units to form a single capacitor, control circuit 1120 may enable formation of more than one capacitor in a stack of alternating layers. For example, a plurality of selection circuits similar to selection circuit 1124 may be controlled by control logic 1130, with each selection circuit (which may be considered a multiplexer or "mux") allowing formation of a separate configurable capacitor. In an embodiment, a number of adjacent word line layers may be connected to a given selection circuit. For example, in the example of FIG. 7B, 96 word line layers may be grouped into 12 groups of 8 word line layers each so that each group includes 4 capacitive units, each formed by a pair of word line layers. Each such group may have a corresponding selection circuit, which may be individually controlled (e.g., dedicated control logic for each group) or commonly controlled (e.g., common control logic for all groups) to form capacitors having target capacitances. Thus, 12 capacitors having up to 12 different target capacitances may be formed using a configurable capacitor structure. Such capacitors may be used in charge pumps or other circuits, with each capacitor including a respective selected plurality of capacitive units in a configurable capacitor structure. Control circuit 1120 (e.g., formed of selection circuit 1124 under control of control logic 1130 as illustrated) may be considered as a means for selecting the respective selected plurality of capacitive units for each of the one or more capacitors.

Figure 12:
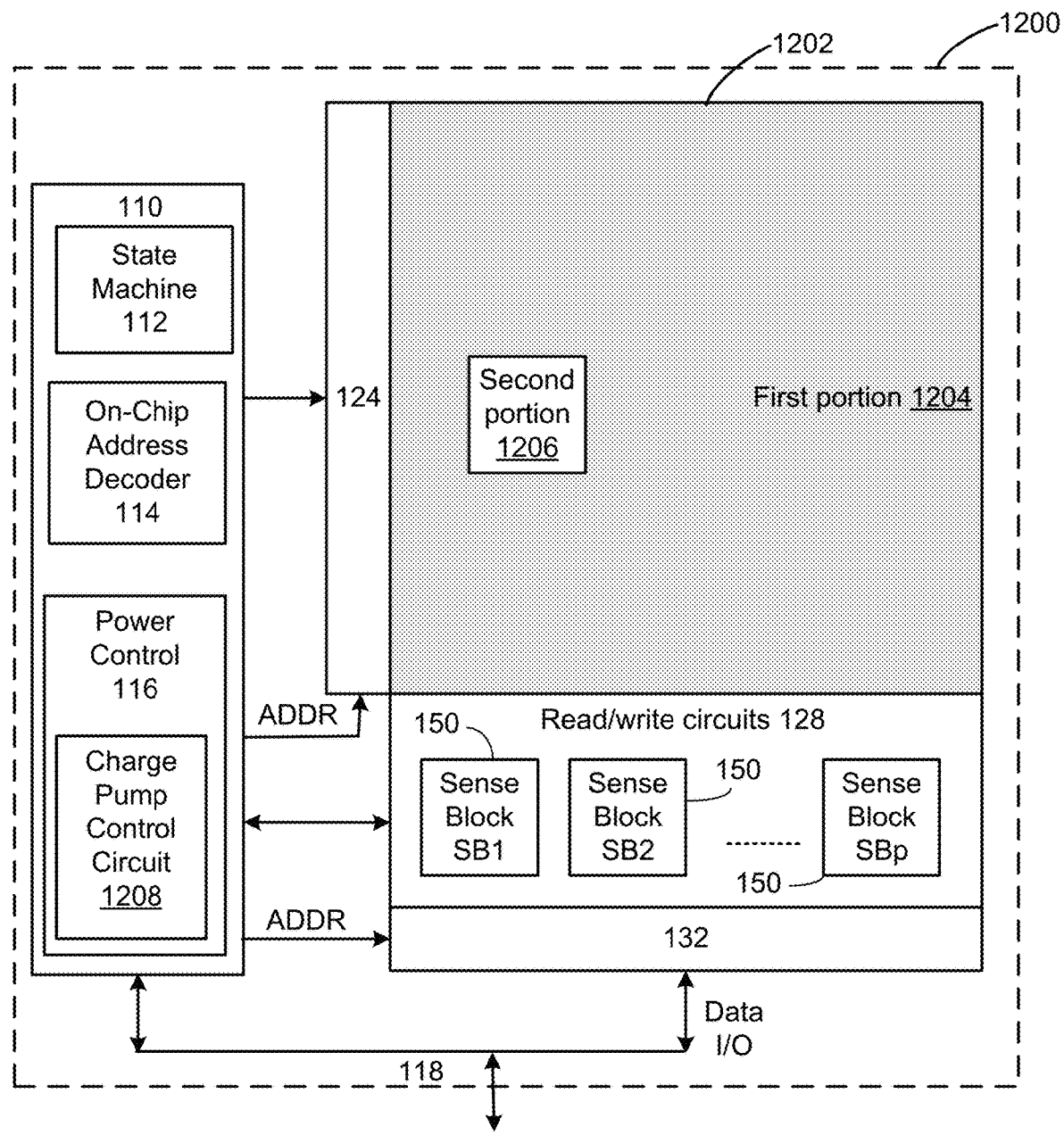
FIG. 12 illustrates an example implementation of stack that includes a first portion forming a plurality of blocks of NAND memory and a second portion forming a configurable capacitor structure.

FIG. 12 shows an example of a memory die 1200 that is configured to implement aspects of the present technology. Memory die 1200 includes several components that are similar to those of memory die 108 of FIG. 1 and are similarly numbered. Memory die 1200 includes an area 1202 that where a stack of alternating layers of dielectric and conductive materials extend on a substrate. Area 1202 includes a first portion 1204 (shaded) where a plurality of blocks of NAND memory are formed (e.g., as illustrated in FIG. 3) and a second portion 1206 where one or more configurable capacitor structures may be formed. In an example, a configurable capacitor structure is equal in size to one block of NAND memory (in other examples, a configurable capacitor structure may be larger or smaller than a block of NAND memory). A charge pump control circuit 1208 may include one or more circuit to configure capacitors in second portion 1206 (e.g., control circuit 1120) and may include one or more circuit to operate a charge pump that uses the capacitors that are configured (e.g., regulation and control circuitry 616). In an example, capacitors are configured during an initialization process prior to storing data in NAND blocks of first portion 1204. For example, charge pumps may be configured to provide desired voltages from a given supply voltage by configuring capacitors of appropriate sizes. Capacitors may be configured to adjust pump strength and output voltage for different user options including, but not limited to erase, program and read. In some examples, capacitors may be reconfigured at one or more time during the lifetime of the product (e.g., after some use) to replace defective components (e.g., shorted capacitive unit) with redundant components (e.g., redundant capacitive unit).

The second region 1206 and charge pump control circuit 1208 may connected by conductive lines and may be located to facilitate connection between these components. For example, second region 1206 may be at an edge of area 1202. While NAND blocks formed in first portion 1204 may be connected to row decoder 124 (e.g., by word lines) read/write circuits 128 (e.g., by bit lines), because no data is stored in, or read from second portion 1206, components in second portion 1206 may not be connected to row decoder 124 or read/write circuits 128.

Figure 13:
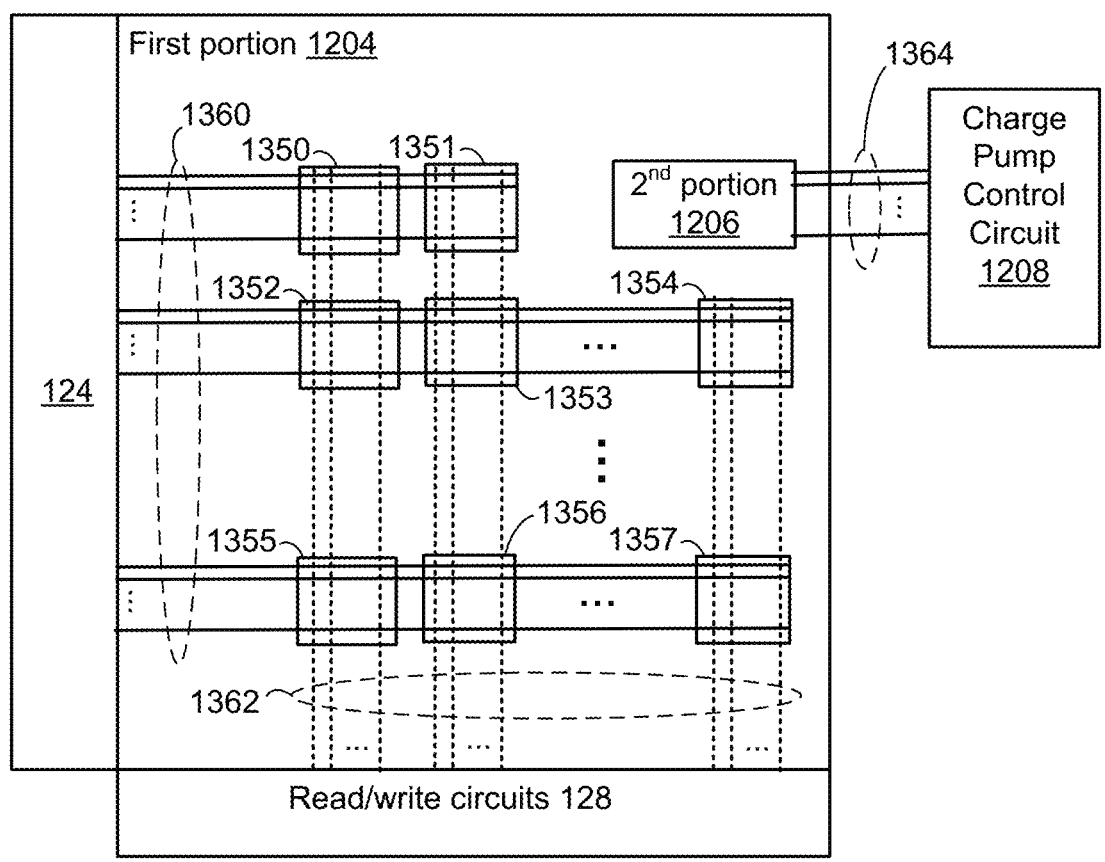
FIG. 13 shows an example configuration of a second portion and charge pump control circuit.

FIG. 13 shows an example arrangement of components of memory die 1200 of FIG. 12. First portion 1204 includes a plurality of blocks including blocks 1350, 1351, 1352, 1353, 1354, 1355, 1356 and 1357 (additional rows and columns of blocks may be included in such an array). Each block is connected to global word lines 1360, which are controlled by row decoder 124. Each block is also connected to global bit lines 1362, which are controlled by read/write circuits 128. Suitable selection circuits may be provided to select a given block. In contrast, components in second portion 1206 are not connected to global word lines 1360 or global bit lines 1362. Components in second portion 1206 are connected to lines 1364 (e.g., portions of WL layers connected to conductive lines 776, 778 as illustrated in FIG. 7C), which connect to charge pump control circuit 1208, which may include a selection circuit (e.g., selection circuit 1124) to select capacitive units to form one or more capacitor. Certain components that are formed in first portion 1204 may be omitted in second portion 1206. For example, memory holes and contents of memory holes, including vertical bit lines, may be omitted in second portion 1206 so that no memory cells are formed in second portion 1206. If such components are formed, vertical bit lines may be floating (unconnected to global bit lines 1362) so that no data is stored or read in any structures formed in second portion 1206.

Figure 14A:
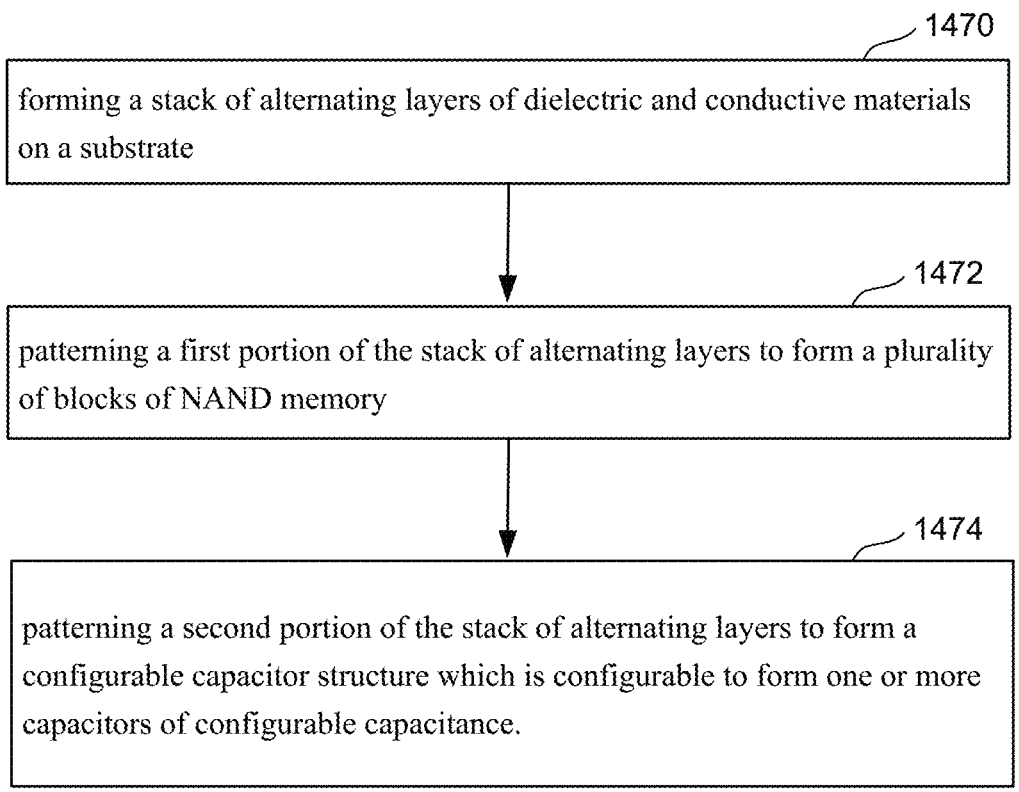
FIGS. 14A-B show examples of a method that includes patterning first and second portions of a stack to form blocks of NAND memory and a configurable capacitor structure.

FIG. 14A illustrates an example of a method that includes forming a stack of alternating layers of dielectric and conductive materials on a substrate 1470, patterning a first portion of the stack of alternating layers to form a plurality of blocks of NAND memory 1472 (e.g., as illustrated in FIG. 3), and patterning a second portion of the stack of alternating layers to form a configurable capacitor structure which is configurable to form one or more capacitors of configurable capacitance 1474 (e.g., by connecting a number of capacitive units to obtain a target capacitance).

While the patterning of the first and second portions of the stack are shown as two different steps (1472 and 1474) in FIG. 14A the processing of these two portions may be performed at the same time using the same process steps including, for example, lithographic patterning, etching, depositing and/or other steps, which may simultaneously form blocks of NAND memory in the first portion and form a configurable capacitor structure in the second portion. In some cases, all process steps are common to both portions. In other cases, some dedicated processing steps may be needed (e.g., to connect capacitive units).

Figure 14B:
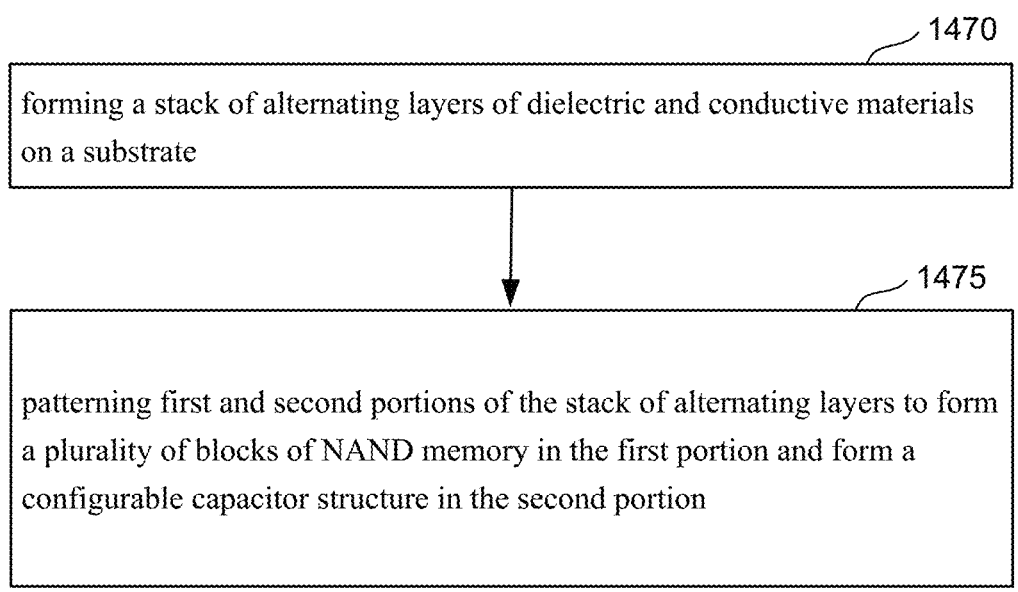

FIG. 14B illustrates an example of a method that includes forming a stack of alternating layers of dielectric and conductive materials on a substrate 1470 and patterning first and second portions of the stack of alternating layers to form a plurality of blocks of NAND memory in the first portion and form a configurable capacitor structure in the second portion 1475 (where patterning may occur at the same time, using the same lithographic mask, same etch steps etc.).

Figure 15:
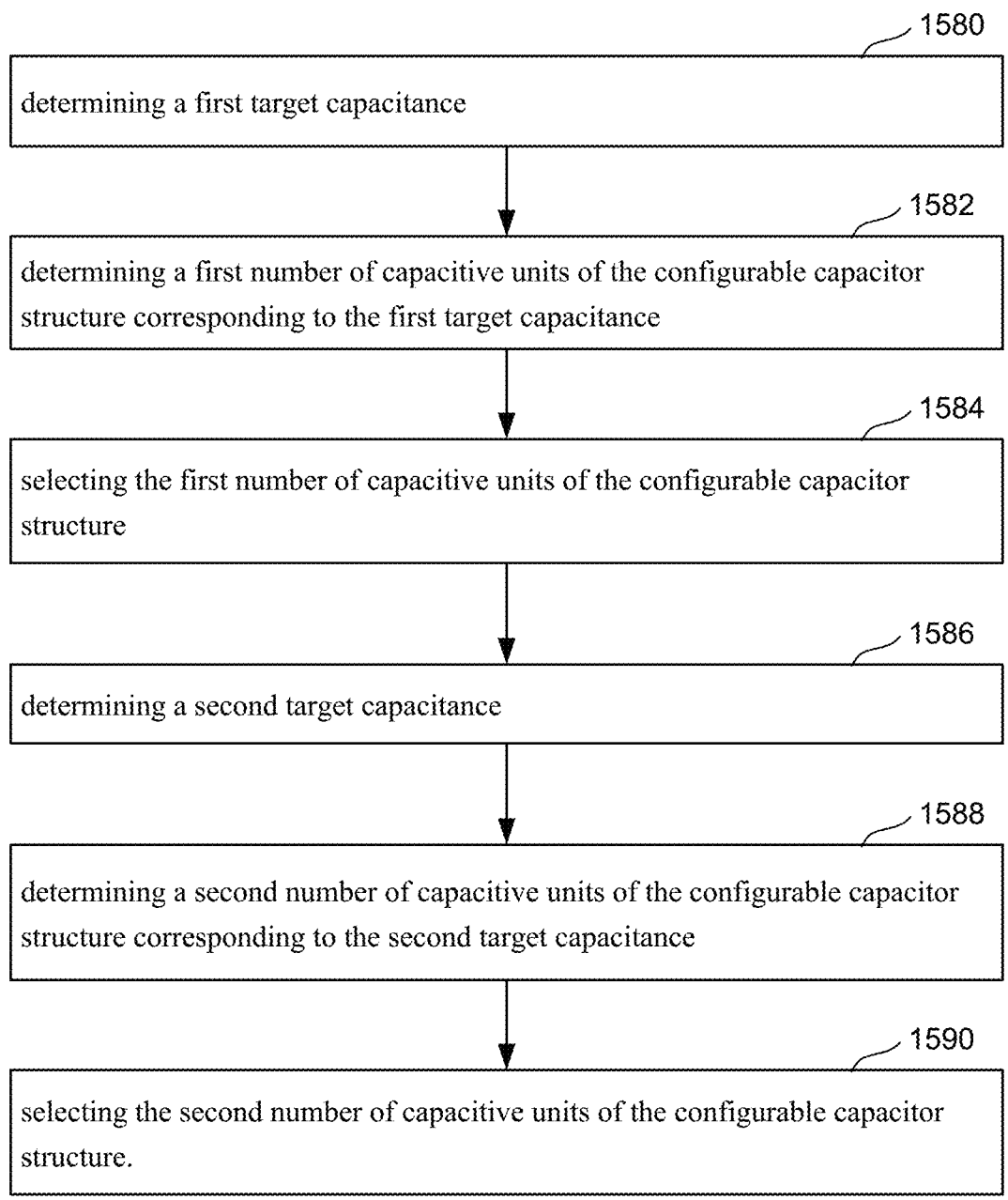
FIG. 15 shows an example of a method of operating a configurable capacitor structure.

FIG. 15 illustrates steps that may be performed in operating a configurable capacitor structure (e.g., a configurable capacitor structure formed as described in FIGS. 14A-B). The method includes determining a first target capacitance 1580 (e.g., based on output voltage requirements of a charge pump that receives a given input voltage), determining a first number of capacitive units of the configurable capacitor structure corresponding to the first target capacitance 1582 (e.g., control logic 1130 determining how many capacitive units are required to obtain the target capacitance) and selecting the first number of capacitive units of the configurable capacitor structure 1584 (e.g., control logic 1130 controlling switches of selection circuit 1124 to select the required capacitive units). The method further includes determining a second target capacitance 1586 (e.g., different from the first target capacitance), determining a second number of capacitive units of the configurable capacitor structure corresponding to the second target capacitance 1588 (e.g., second number of capacitive units different to the first number) and selecting the second number of capacitive units of the configurable capacitor structure 1590. The first and second output voltages may be used for access operations (e.g., read, write and erase operations) directed to blocks of NAND memory on the same die.

The steps illustrated in FIG. 15 may be extended to obtain any number of target capacitances. Such steps may be performed as part of a one-time configuration process (e.g., prior to storing data in a memory structure) and/or may be performed as part of a reconfiguration process (e.g., an on-the-fly reconfiguration to optimize one or more voltage during the life of a product, in response to a change in input voltage, or otherwise).

In one embodiment an apparatus includes a stack of alternating layers of dielectric and conductive materials on a substrate. A first portion of the stack of alternating layers forms a plurality of blocks of NAND memory. A second portion of the stack of alternating layers forms a configurable capacitor structure which is configurable to form one or more capacitors of configurable capacitance.

The apparatus may further include a control circuit connected to the configurable capacitor structure to configure the configurable capacitor structure to provide at least one target capacitance. The control circuit may include a selection circuit that is controlled by the control circuit, the selection circuit enabling connection of a selected number of capacitive units to provide the at least one target capacitance. The control circuit may be configured to detect that one or more capacitive units in the configurable capacitor structure is defective and the selection circuit may be configured to connect only capacitive units that are not defective to provide the at least one target capacitance. The configurable capacitor structure may include a plurality of capacitive units and each capacitive unit may include a plurality of capacitive elements that are each formed in common layers of conductive material separated by a layer of dielectric material of the stack. The plurality of capacitive elements of a capacitive unit may be connected in series. The plurality of capacitive elements of a capacitive unit may be connected in parallel. The configurable capacitor structure may include a first plurality of capacitive units having capacitive elements connected in series to each have a first capacitance, a second plurality of capacitive units having capacitive elements connected in parallel to each have a second capacitance and a selection circuit configured to select one or more of the first plurality of capacitive units and the second plurality of capacitive units. A capacitive unit may further include a plurality of switches that are configurable to selectively connect capacitive elements of the capacitive unit in series or in parallel. The one or more capacitors may be connected in a charge pump circuit to provide one or more voltage for operations directed to the plurality of blocks of NAND memory. The one or more capacitors may be connected to power nodes configured to supply power to the blocks of NAND memory.

An example method includes forming a stack of alternating layers of dielectric and conductive materials on a substrate; patterning a first portion of the stack of alternating layers to form a plurality of blocks of NAND memory; and patterning a second portion of the stack of alternating layers to form a configurable capacitor structure which is configurable to form one or more capacitors of configurable capacitance.

The method may further include connecting the plurality of blocks of NAND memory to block select circuits and connecting the configurable capacitor structure directly to one or more peripheral circuit. The one or more peripheral circuit may include charge pump switches of a charge pump. The method may further include determining a first target capacitance; determining a first number of capacitive units of the configurable capacitor structure corresponding to the first target capacitance; and selecting the first number of capacitive units of the configurable capacitor structure. The method may further include determining a second target capacitance; determining a second number of capacitive units of the configurable capacitor structure corresponding to the second target capacitance; and selecting the second number of capacitive units of the configurable capacitor structure. The first target capacitance may correspond to a first output voltage of a charge pump circuit, the second target capacitance may correspond to a second output voltage of the charge pump circuit, the first and second output voltages used for access operations directed to the plurality of blocks of NAND memory.

An example memory die includes a plurality of blocks of NAND memory formed in a stack of alternating layers of dielectric and conductive materials on a substrate; a configurable capacitor structure that includes a plurality of separately selectable capacitive units formed in the stack of alternating layers of dielectric and conductive materials on the substrate; a charge pump circuit that includes one or more capacitor, each capacitor including a respective selected plurality of capacitive units in the configurable capacitor structure; and means for selecting the respective selected plurality of capacitive units for each of the one or more capacitors.

The plurality of separately selectable capacitive units may include one or more configurable capacitive unit, each configurable capacitive unit includes a plurality of capacitive elements that are connectable in a plurality of configurations to provide a plurality of different capacitances. The memory die may further include means for selectively configuring the plurality of capacitive elements of a configurable capacitive unit in series to have a first capacitance and in parallel to have a second capacitance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a stack of alternating layers of dielectric and conductive materials on a substrate, a first portion of the stack of alternating layers forming a plurality of blocks of NAND memory, a second portion of the stack of alternating layers forming a configurable capacitor structure which is configurable to form one or more capacitors of configurable capacitance, the configurable capacitor structure includes a plurality of capacitive units, each capacitive unit includes a plurality of capacitive elements that are each formed in common layers of conductive material separated by a layer of dielectric material of the stack and one or more capacitive unit further includes a plurality of switches that are configurable to selectively connect capacitive elements of the capacitive unit in series or in parallel.

2. The apparatus of claim 1, further comprising a control circuit connected to the configurable capacitor structure to configure the configurable capacitor structure to provide at least one target capacitance.

3. The apparatus of claim 2, wherein the control circuit includes a selection circuit that is controlled by the control circuit, the selection circuit enabling connection of a selected number of capacitive units to provide the at least one target capacitance.

4. The apparatus of claim 3, wherein the control circuit is configured to detect that one or more capacitive units in the configurable capacitor structure is defective and the selection circuit is configured to connect only capacitive units that are not defective to provide the at least one target capacitance.

5. The apparatus of claim 1, wherein the plurality of capacitive elements of one or more additional capacitive unit are connected in series.

6. The apparatus of claim 1, wherein the plurality of capacitive elements of one or more additional capacitive unit are connected in parallel.

7. The apparatus of claim 1, wherein the configurable capacitor structure includes a first plurality of capacitive units having capacitive elements connected in series to each have a first capacitance, a second plurality of capacitive units having capacitive elements connected in parallel to each have a second capacitance and a selection circuit configured to select one or more of the first plurality of capacitive units and the second plurality of capacitive units.

8. The apparatus of claim 1, wherein the plurality of switches are configurable to connect first capacitive elements of the capacitive unit in series while connecting second capacitive elements of the capacitive unit in parallel.

9. The apparatus of claim 1, wherein the one or more capacitors are connected in a charge pump circuit to provide one or more voltage for operations directed to the plurality of blocks of NAND memory.

10. The apparatus of claim 1, wherein the one or more capacitors are connected to power nodes configured to supply power to the blocks of NAND memory.

* * * * *